(12) United States Patent
Ono et al.

(10) Patent No.: US 12,339,580 B2
(45) Date of Patent: Jun. 24, 2025

(54) REFLECTIVE MASK BLANK FOR EUV LITHOGRAPHY AND SUBSTRATE EQUIPPED WITH CONDUCTIVE FILM

(71) Applicant: AGC Inc., Tokyo (JP)

(72) Inventors: Yusuke Ono, Fukushima (JP); Hiroaki Iwaoka, Fukushima (JP); Taiga Fudetani, Fukushima (JP)

(73) Assignee: AGC Inc., Tokyo (JP)

( * ) Notice: Subject to any disclaimer, the term of this patent is extended or adjusted under 35 U.S.C. 154(b) by 0 days.

(21) Appl. No.: 18/948,779

(22) Filed: Nov. 15, 2024

(65) Prior Publication Data

US 2025/0076748 A1  Mar. 6, 2025

Related U.S. Application Data

(63) Continuation of application No. PCT/JP2024/008906, filed on Mar. 7, 2024.

(51) Int. Cl.
*G03F 1/24* (2012.01)

(52) U.S. Cl.
CPC ..................... *G03F 1/24* (2013.01)

(58) Field of Classification Search
CPC ........................................... G03F 1/24
USPC .......................................... 430/5
See application file for complete search history.

(56) References Cited

U.S. PATENT DOCUMENTS

| 2018/0157162 A1 | 6/2018 | Pruneri et al. |
| 2019/0056653 A1 | 2/2019 | Kawahara et al. |
| 2019/0179225 A1 | 6/2019 | Seo et al. |
| 2021/0103209 A1 | 4/2021 | Nakagawa et al. |

FOREIGN PATENT DOCUMENTS

| JP | 2015-015420 A | 1/2015 |
| JP | 2019-035848 A | 3/2019 |
| JP | 2021-128247 A | 9/2021 |
| WO | 2019-131506 A1 | 7/2019 |

OTHER PUBLICATIONS

International Search Report issued May 21, 2024, in International Application No. PCT/JP2024/008906, with English Translation, references 1-2 and 16-18 cited therein.

*Primary Examiner* — Christopher G Young
(74) *Attorney, Agent, or Firm* — Oblon, McClelland, Maier & Neustadt, L.L.P.

(57) ABSTRACT

A reflective mask blank for EUV lithography, includes: a substrate; a conductive film disposed on or above a back surface of the substrate; a reflective layer disposed on or above a front surface of the substrate, the reflective layer reflecting EUV light; and an absorption layer disposed on or above the reflective layer, the absorption layer absorbing the EUV light.

28 Claims, 1 Drawing Sheet

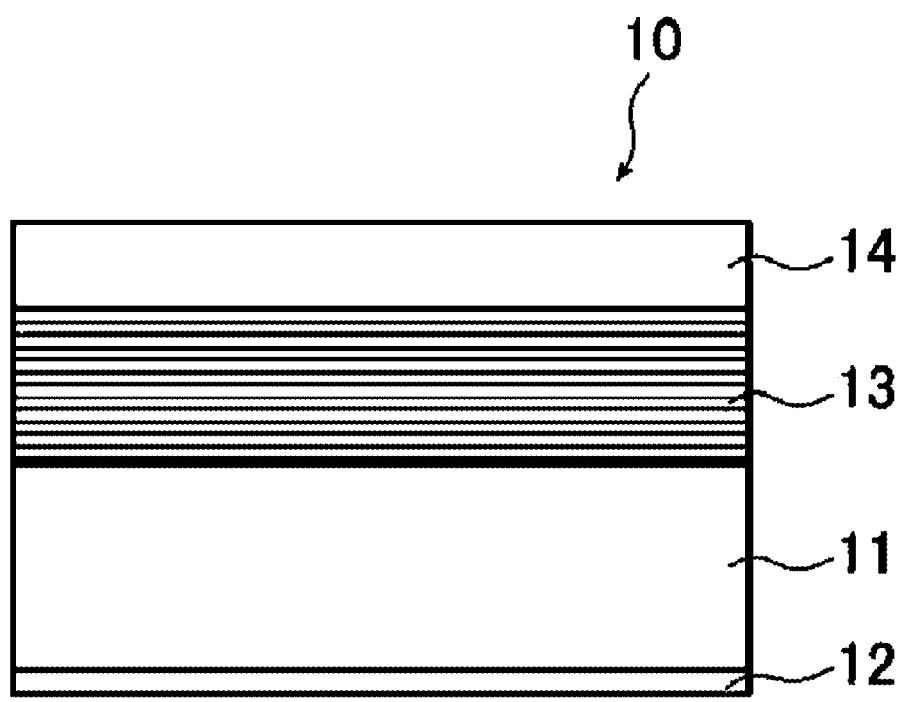

REFLECTIVE MASK BLANK FOR EUV LITHOGRAPHY AND SUBSTRATE EQUIPPED WITH CONDUCTIVE FILM

CROSS-REFERENCE TO RELATED APPLICATIONS

This is a bypass continuation of International Patent Application No. PCT/JP2024/008906, filed on Mar. 7, 2024, which claims priority to Japanese Patent Application No. 2023-043149, filed on Mar. 17, 2023. The contents of these applications are hereby incorporated by reference in their entireties.

TECHNICAL FIELD

The present invention relates to a reflective mask blank for extreme ultra violet (EUV) lithography (hereinafter referred to as an "EUV mask blank" in the present description) used for producing a semiconductor or the like, and a substrate with a conductive film used for producing the EUV mask blank.

BACKGROUND ART

According to the related art, in the semiconductor industry, a photolithography method using visible light or ultraviolet light has been used as a fine pattern transfer technique necessary for forming an integrated circuit including fine patterns on a Si substrate or the like. However, while miniaturization of a semiconductor device is accelerated, the limit of the photolithography method according to the related art has been approached. In the case of the photolithography method, a resolution limit of the pattern is about ½ of an exposure wavelength. Even when a liquid immersion method is used, it is said that the resolution limit is about ¼ of the exposure wavelength, and even when a liquid immersion method using ArF lasers (193 nm) is used, the limit is expected to be about 20 nm to 30 nm. As an exposure technique for the resolution limit below 20 nm to 30 nm, EUV lithography of an exposure technique using EUV light having a wavelength shorter than that of an ArF laser is expected. In the present description, the EUV light refers to a light beam having a wavelength in a soft X-ray region or a vacuum ultraviolet region. Specifically, the EUV light refers to a light beam having a wavelength of about 10 nm to 20 nm, particularly about 13.5 nm+0.3 nm.

The EUV light is easily absorbed by various substances, and the refractive index of the substance is close to 1 at this wavelength. Therefore, a refractive optical system according to the related art, such as photolithography using visible light or ultraviolet light, cannot be used. Therefore, in the EUV lithography, a reflective optical system, that is, a reflective photomask and a mirror are used.

On the other hand, in addition to shortening of the wavelength of light, a technique for improving the resolution using a phase shift mask has been proposed. The phase shift mask applies a phase difference of 180 degrees to the light transmitted through a mask pattern by forming a transmission portion of the mask pattern which is different from an adjacent transmission portion in material or shape. Accordingly, in a region between the two transmission portions, the transmitted diffracted lights having phases different from each other by 180 degrees cancel each other out, the light intensity becomes extremely small, and thus the mask contrast is improved. As a result, the depth of focus during transfer is increased, and the transfer accuracy is improved. In principle, the best phase difference is 180 degrees, but if the phase difference is substantially about 175 degrees to 185 degrees, the effect of improving the resolution can be sufficiently obtained.

The mask blank is a pre-patterning laminate used for production of photomasks. The EUV mask blank has a structure in which a reflective layer reflecting EUV light and an absorption layer absorbing EUV light are formed in this order on or above a substrate made of glass or the like.

As the reflective layer, a multilayer reflective film, whose light reflectance is increased during irradiation of a layer surface with EUV light by alternately laminating a low-refractive-index layer having a low refractive index with respect to the EUV light and a high-refractive-index layer having a high refractive index with respect to the EUV light, is generally used. A molybdenum (Mo) layer is generally used as the low-refractive-index layer of the multilayer reflective film, and a silicon (Si) layer is generally used as the high-refractive-index layer.

For the absorption layer, a material having a high absorption coefficient for EUV light, specifically, for example, a material containing chromium (Cr) or tantalum (Ta) as a main component is used.

The multilayer reflective film and the absorption layer are formed on or above an optical surface of a glass substrate by using an ion beam sputtering method or a magnetron sputtering method. In the case where the multilayer reflective film and the absorption layer are formed, the glass substrate is held by a support means. Examples of the support means for the glass substrate includes a mechanical chuck and an electrostatic chuck, and the electrostatic chuck is preferably used based on the problem of dust generation. In addition, in the mask patterning process or the mask handling during exposure, the electrostatic chuck is used as the support means for the glass substrate.

In the technique according to the related art, the electrostatic chuck is used as a support means for a silicon (Si) wafer in a production process of a semiconductor device. Therefore, in the case of a substrate having a low dielectric constant and a low conductivity, such as a glass substrate, it is necessary to apply a high voltage in order to obtain the same degree of chucking force as in the case of a Si wafer, and thus, there is a risk of insulation destruction.

Therefore, in order to promote electrostatic chucking of the substrate, a conductive film is formed on a side opposite to the multilayer reflective film with the substrate interposed therebetween.

In the EUV mask and the EUV mask blank used for the EUV mask, deformation of a substrate caused by internal stress in a multilayer reflective film as a reflective layer or an absorption layer may cause a problem. A technique for reducing deformation of a substrate due to internal stress in a multilayer reflective film or an absorption layer by locally heating a glass substrate by locally irradiating the glass substrate with pulsed laser light from a back surface side of an EUV mask or an EUV mask blank is newly introduced.

In order to apply the above-described technique, Patent Literature 1 provides an EUV mask blank in which a conductive film is formed on or above a back surface having a high light transmittance at a wavelength of 400 nm to 800 nm.

CITATION LIST

Patent Literature

Patent Literature 1: JP2015-15420A

SUMMARY OF INVENTION

On the other hand, an Ar laser having a wavelength of 488 nm is used for defect inspection after formation of the conductive film. In the case where the conductive film has a high light transmittance in this wavelength range, the defect inspection cannot be performed. Therefore, the conductive film is required to have a low light transmittance in this wavelength range.

In the case where an Ar laser having the wavelength of 488 nm is used for the defect inspection after the formation of the conductive film, an Nd: YAG laser having a wavelength of 1064 nm or a He: Ne laser having a wavelength of 632 nm can be used for reducing the deformation of the substrate due to the internal stress in the multilayer reflective film or the absorption layer by locally emitting a laser. In the case where these lasers are used, the conductive film is required to have a high light transmittance in the wavelength range.

In addition, the EUV mask blank is applied to an exposure device after a pattern is formed in the absorption layer. At this time, when the EUV mask blank on which the conductive film is formed is fixed to the exposure device, the fixing force may be insufficient. In order to prevent such fixing force from becoming insufficient, it is effective to reduce resistivity of the conductive film.

To solve the problems of the above-described technique according to the related art, an object of the present invention is to provide an EUV mask blank which sufficiently transmits a light having a wavelength in a range of 1000 nm to 1100 nm and a light having a wavelength in a range of 600 nm to 700 nm and has excellent fixing force during fixing to an exposure device while preventing transmission of a light having a wavelength in a range of 400 nm to 500 nm in the case where the light is incident from a conductive film side, and to provide a substrate with a conductive film used for producing the EUV mask blank.

The present inventors have found that the above-described problems can be solved by the following configurations.

(1) A reflective mask blank for EUV lithography, comprising:
a substrate;
a conductive film disposed on or above a back surface of the substrate;
a reflective layer disposed on or above a front surface of the substrate, the reflective layer reflecting EUV light; and
an absorption layer disposed on or above the reflective layer, the absorption layer absorbing the EUV light,
wherein the conductive film comprises at least one of nitrogen (N) and boron (B),
a total content of N and B contained in the conductive film is more than 0 at % and 65 at % or less,
the conductive film has a refractive index $n_{\lambda 1000\text{-}1100\ nm}$ of 5.300 or less and has an extinction coefficient $k_{\lambda 1000\text{-}1100\ nm}$ of 5.200 or less, at a wavelength of 1000 nm to 1100 nm,
the conductive film has a refractive index $n_{\lambda 600\text{-}700\ nm}$ of 4.300 or less and has an extinction coefficient $k_{\lambda 600\text{-}700\ nm}$ of 4.500 or less, at a wavelength of 600 nm to 700 nm,
the conductive film has a refractive index $n_{\lambda 400\text{-}500\ nm}$ of 2.500 or more and has an extinction coefficient $k_{\lambda 400\text{-}500\ nm}$ of 0.440 or more, at a wavelength of 400 nm to 500 nm, the conductive film has a film thickness t of 20 nm to 350 nm, and the conductive film has a resistivity of 3.5 mΩ·cm or less.

(2) A reflective mask blank for EUV lithography, comprising:
a substrate;
a conductive film disposed on or above a back surface of the substrate;
a reflective layer disposed on or above a front surface of the substrate, the reflective layer reflecting EUV light; and
an absorption layer disposed on or above the reflective layer, the absorption layer absorbing the EUV light,
wherein the conductive film comprises at least one of nitrogen (N) and boron (B),
a total content of N and B contained in the conductive film is more than 0 at % and 65 at % or less,
the conductive film has a refractive index $n_{\lambda 1000\text{-}1100\ nm}$ of 5.300 or less and has an extinction coefficient $k_{\lambda 1000\text{-}1100\ nm}$ of 5.200 or less, at a wavelength of 1000 nm to 1100 nm,
the conductive film has a refractive index $n_{\lambda 600\text{-}700\ nm}$ of 4.300 or less and has an extinction coefficient $k_{\lambda 600\text{-}700\ nm}$ of 4.500 or less, at a wavelength of 600 nm to 700 nm,
the conductive film has a refractive index $n_{\lambda 480\text{-}500\ nm}$ of 2.500 or more and has an extinction coefficient $k_{\lambda 480\text{-}500\ nm}$ of 0.440 or more, at a wavelength of 480 nm to 500 nm,
the conductive film has a film thickness t of 20 nm to 350 nm, and
the conductive film has a resistivity of 3.5 mΩ·cm or less.

(3) The reflective mask blank for EUV lithography according to (1) or (2), wherein the conductive film comprises at least one of tantalum (Ta) and chromium (Cr).

(4) The reflective mask blank for EUV lithography according to (1) or (2), wherein the conductive film comprises Ta and N.

(5) The reflective mask blank for EUV lithography according to (4), wherein the conductive film comprises N in an amount of more than 0 at % and 65 at % or less.

(6) The reflective mask blank for EUV lithography according to (1) or (2), wherein the conductive film comprises Ta and B.

(7) The reflective mask blank for EUV lithography according to (6), wherein the conductive film comprises B in an amount of more than 0 at % and 35 at % or less.

(8) The reflective mask blank for EUV lithography according to (1) or (2), wherein the resistivity of the conductive film is 0.050 mΩ·cm or more and 3.5 mΩ·cm or less.

(9) The reflective mask blank for EUV lithography according to (1) or (2), wherein the conductive film comprises Ta, and a full width at half maximum FWHM of a diffraction peak attributed to a bcc (110) plane of Ta among diffraction peaks derived from the conductive film and observed by an out-of-plane XRD method is 1.5° to 4.0°.

(10) The reflective mask blank for EUV lithography according to (1) or (2), wherein the conductive film has a light transmittance at the wavelength of 1000 nm to 1100 nm of 1.0% or more, a light transmittance at the wavelength of 600 nm to 700 nm of 1.0% or more, and a light transmittance at the wavelength of 400 nm to 500 nm of 1.0% or less.

(11) The reflective mask blank for EUV lithography according to (1) or (2), wherein the conductive film has a sheet resistance value of 250 Ω/sq. or less.

(12) The reflective mask blank for EUV lithography according to (1) or (2), wherein the conductive film has a surface hardness of 10.0 GPa or more.

(13) The reflective mask blank for EUV lithography according to (1) or (2), wherein the reflective mask blank further comprises an upper layer disposed on or above the conductive film, and the upper layer comprises chromium (Cr) and at least one element selected from the group consisting of nitrogen (N) and oxygen (O).

(14) The reflective mask blank for EUV lithography according to (1) or (2), wherein the conductive film has a surface roughness (Rq) of 0.600 nm or less.

(15) A substrate with a conductive film, comprising:
a conductive film disposed on or above the substrate, wherein the conductive film comprises at least one of nitrogen (N) and boron (B),
a total content of N and B contained in the conductive film is more than 0 at % and 65 at % or less,
the conductive film has a refractive index $n_{\lambda 1000\text{-}1100\ nm}$ of 5.300 or less and has an extinction coefficient $k_{\lambda 1000\text{-}1100\ nm}$ of 5.200 or less, at a wavelength of 1000 nm to 1100 nm,
the conductive film has a refractive index $n_{\lambda 600\text{-}700\ nm}$ of 4.300 or less and has an extinction coefficient $k_{\lambda 600\text{-}700\ nm}$ of 4.500 or less, at a wavelength of 600 nm to 700 nm,
the conductive film has a refractive index $n_{\lambda 400\text{-}500\ nm}$ of 2.500 or more and has an extinction coefficient $k_{\lambda 400\text{-}500\ nm}$ of 0.440 or more, at a wavelength of 400 nm to 500 nm,
the conductive film has a film thickness t of 20 nm to 350 nm, and
the conductive film has a resistivity of 3.5 mΩ·cm or less.

(16) A substrate with a conductive film, comprising:
a conductive film disposed on or above the substrate, wherein the conductive film comprises at least one of nitrogen (N) and boron (B),
a total content of N and B contained in the conductive film is more than 0 at % and 65 at % or less,
the conductive film has a refractive index $n_{\lambda 1000\text{-}1100\ nm}$ of 5.300 or less and has an extinction coefficient $k_{\lambda 1000\text{-}1100\ nm}$ of 5.200 or less, at a wavelength of 1000 nm to 1100 nm,
the conductive film has a refractive index $n_{\lambda 600\text{-}700\ nm}$ of 4.300 or less and has an extinction coefficient $k_{\lambda 600\text{-}700\ nm}$ of 4.500 or less, at a wavelength of 600 nm to 700 nm,
the conductive film has a refractive index $n_{\lambda 480\text{-}500\ nm}$ of 2.500 or more and has an extinction coefficient $k_{\lambda 480\text{-}500\ nm}$ of 0.440 or more, at a wavelength of 480 nm to 500 nm,
the conductive film has a film thickness t of 20 nm to 350 nm, and
the conductive film has a resistivity of 3.5 mΩ·cm or less.

(17) The substrate with the conductive film according to (15) or (16), wherein the conductive film comprises at least one of tantalum (Ta) and chromium (Cr).

(18) The substrate with the conductive film according to (15) or (16), wherein the conductive film comprises Ta and N.

(19) The substrate with the conductive film according to (18), wherein the conductive film comprises N in an amount of more than 0 at % and 65 at % or less.

(20) The substrate with the conductive film according to (15) or (16), wherein the conductive film comprises Ta and B.

(21) The substrate with the conductive film according to (20), wherein the conductive film comprises B in an amount of more than 0 at % and 35 at % or less.

(22) The substrate with the conductive film according to (15) or (16), wherein the resistivity of the conductive film is 0.050 mΩ·cm or more and 3.5 mΩ·cm or less.

(23) The substrate with the conductive film according to (15) or (16), wherein the conductive film comprises Ta, and a full width at half maximum FWHM of a diffraction peak attributed to a bcc (110) plane of Ta among diffraction peaks derived from the conductive film and observed by an out-of-plane XRD method is 1.5° to 4.0°.

(24) The substrate with the conductive film according to (15) or (16), wherein the conductive film has a light transmittance at the wavelength of 1000 nm to 1100 nm of 1.0% or more, a light transmittance at the wavelength of 600 nm to 700 nm of 1.0% or more, and a light transmittance at the wavelength of 400 nm to 500 nm of 1.0% or less.

(25) The substrate with the conductive film according to (15) or (16), wherein the conductive film has a sheet resistance value of 250 Ω/sq. or less.

(26) The substrate with the conductive film according to (15) or (16), wherein the conductive film has a surface hardness of 10.0 GPa or more.

(27) The substrate with the conductive film according to (15) or (16), wherein the substrate with the conductive film further comprises an upper layer disposed on or above the conductive film, and the upper layer comprises chromium (Cr) and at least one element selected from the group consisting of nitrogen (N) and oxygen (O).

(28) The substrate with the conductive film according to (15) or (16), wherein the conductive film has a surface roughness (Rq) of 0.600 nm or less.

An EUV mask blank according to the present invention (hereinafter, also referred to as the EUV mask blank according to the present embodiment) transmits a light having a wavelength in a range of 1000 nm to 1100 nm and a light having a wavelength in a range of 600 nm to 700 nm, and prevents transmission of a light having a wavelength in a range of 400 nm to 500 nm in the case where the light is incident from a conductive film side. When the resistivity of the conductive film is sufficiently low, an excellent fixing force is obtained during fixing to the exposure device.

BRIEF DESCRIPTION OF DRAWINGS

The FIG. 1s a schematic cross-sectional view illustrating an embodiment of an EUV mask blank according to the present invention.

DESCRIPTION OF EMBODIMENTS

According to a first aspect of an EUV mask blank in the present embodiment, there is provided a reflective mask blank for EUV lithography, including: a substrate; a conductive film disposed on or above a back surface of the substrate; a reflective layer disposed on or above a front surface of the substrate, the reflective layer reflecting EUV light; and an absorption layer disposed on or above the reflective layer, the absorption layer absorbing the EUV light, in which the conductive film contains at least one of nitrogen (N) and boron (B), a total content of N and B contained in the conductive film is more than 0 at % and 65 at % or less, the conductive film has a refractive index $n_{\lambda 1000-1100\ nm}$ of 5.300 or less and has an extinction coefficient $k_{\lambda 1000-1100\ nm}$ of 5.200 or less, at a wavelength of 1000 nm to 1100 nm, the conductive film has a refractive index $n_{\lambda 600-700\ nm}$ of 4.300 or less and has an extinction coefficient $k_{\lambda 0.600-700\ nm}$ of 4.500 or less, at a wavelength of 600 nm to 700 nm, the conductive film has a refractive index $n_{\lambda 400-500\ nm}$ of 2.500 or more and has an extinction coefficient $k_{\lambda 400-500\ nm}$ of 0.440 or more, at a wavelength of 400 nm to 500 nm, the conductive film has a film thickness t of 20 nm to 350 nm, and the conductive film has a resistivity of 3.5 mΩ·cm or less.

According to a second aspect of the EUV mask blank in the embodiment of the present invention, there is provided a reflective mask blank for EUV lithography, including: a substrate; a conductive film disposed on or above a back surface of the substrate; a reflective layer disposed on or above a front surface of the substrate, the reflective layer reflecting EUV light; and an absorption layer disposed on or above the reflective layer, the absorption layer absorbing the EUV light, in which the conductive film contains at least one of nitrogen (N) and boron (B), a total content of N and B contained in the conductive film is more than 0 at % and 65 at % or less, the conductive film has a refractive index $n_{\lambda 1000-1100\ nm}$ of 5.300 or less and has an extinction coefficient $k_{\lambda 1000-1100\ nm}$ of 5.200 or less, at a wavelength of 1000 nm to 1100 nm, the conductive film has a refractive index $n_{\lambda 600-700\ nm}$ of 4.300 or less and has an extinction coefficient $k_{\lambda 600-700\ nm}$ of 4.500 or less, at a wavelength of 600 nm to 700 nm, the conductive film has a refractive index $n_{\lambda 480-500\ nm}$ of 2.500 or more and has an extinction coefficient $k_{\lambda 480-500\ nm}$ of 0.440 or more, at a wavelength of 480 nm to 500 nm, the conductive film has a film thickness t of 20 nm to 350 nm, and the conductive film has a resistivity of 3.5 mΩ·cm or less.

Hereinafter, an EUV mask blank according to the present embodiment will be described with reference to the FIGURE. The following description of the EUV mask blank according to the present embodiment applies to both the first aspect and the second aspect of the EUV mask blank according to the present embodiment unless otherwise specified.

The FIG. 1s a schematic cross-sectional view illustrating one embodiment of the EUV mask blank according to the present invention. In an EUV mask blank 10 illustrated in the FIGURE, a reflective layer 13 reflecting EUV light and an absorption layer 14 absorbing EUV light are formed in this order on or above one surface of a substrate 11 (an upper surface of the substrate 11 in the FIGURE). A conductive film 12 is formed on the other surface of the substrate 11 (a lower surface of the substrate 11 in the FIGURE). Hereinafter, in the present description, the surface of the substrate 11 on or above which the reflective layer 13 and the absorption layer 14 are disposed is referred to as a front surface of the substrate 11, and the surface of the substrate 11 on or above which the conductive film 12 is disposed is referred to as a back surface of the substrate 11.

Hereinafter, individual components of the EUV mask blank 10 according to the present embodiment will be described.

The substrate 11 satisfies characteristics as a substrate for an EUV mask blank. Therefore, the substrate 11 has a low coefficient of thermal expansion, and is excellent in smoothness, flatness, and resistance to a cleaning solution used for cleaning a mask blank or a photomask after pattern formation. Here, the above-described low coefficient of thermal expansion means that the coefficient of thermal expansion at 20° C. is preferably 0±0.05×10$^{-7}$/° C., and more preferably 0±0.03×10$^{-7}$/° C. As the substrate 11, specifically, a glass having a low coefficient of thermal expansion, for example, a SiO$_2$—TiO$_2$ glass is used, but the substrate 11 is not limited thereto. A substrate made of a crystallized glass in which a β-quartz solid solution is precipitated, a quartz glass, silicon, a metal, or the like can also be used.

The substrate 11 having a smooth surface with a surface roughness (Rq) of 0.15 nm or less and a flatness of 100 nm or less is preferred because high reflectance and high transfer accuracy can be obtained for a photomask after pattern formation.

A size, thickness, and the like of the substrate 11 are appropriately determined according to design values and the like of the mask. In Examples described later, an SiO$_2$—TiO$_2$ glass having an outer shape of 6-inch (152 mm) square and a thickness of 0.25 inches (6.3 mm) was used.

The front surface of the substrate 11 preferably has no defects. However, even in the case where defects are present, the defects are acceptable as long as recessed defects and/or protruding defects do not cause the generation of phase defects. Specifically, a depth of a recessed defect and a height of a protruding defect are preferably 2 nm or less, and a full width at half maximum of the recessed defect and the protruding defect is preferably 60 nm or less. The full width at half maximum of the recessed defect refers to a width at a depth position that is ½ of the depth of the recessed defect. The full width at half maximum of the protruding defect refers to a width at a height position that is ½ of the height of the protruding defect.

Regarding the conductive film 12, a refractive index $n_{\lambda 1000-1100\ nm}$ is 5.300 or less, and an extinction coefficient $k_{\lambda 1000-1100\ nm}$ is 5.200 or less, at a wavelength of 1000 nm to 1100 nm.

In the case where the refractive index $n_{\lambda 1000-1100\ nm}$ and the extinction coefficient $k_{\lambda 1000-1100\ nm}$ are in the above-described ranges, the conductive film 12 has a high light transmittance at the wavelength of 1000 nm to 1100 nm. Therefore, the above-described ranges are preferred when an Nd:YAG laser having a wavelength of 1064 nm is used to reduce the deformation of the substrate.

The light transmittance of the conductive film 12 at the wavelength of 1000 nm to 1100 nm is preferably 1.0% or more, more preferably 2.0% or more, and still more preferably 2.5% or more. The upper limit of the light transmittance of the conductive film 12 at the wavelength of 1000 nm to 1100 nm is not particularly limited, and is, for example, 3.5% or less.

The refractive index $n_{\lambda 1000-1100\ nm}$ of the conductive film 12 is preferably 5.200 or less. The lower limit of the refractive index $n_{\lambda 1000-1100\ nm}$ of the conductive film 12 is not particularly limited, and is, for example, 4.000 or more.

The extinction coefficient $k_{\lambda 1000-1100\ nm}$ of the conductive film 12 is preferably 5.100 or less. The lower limit of the extinction coefficient $k_{\lambda 1000-1100\ nm}$ of the conductive film 12 is not particularly limited, and is, for example, 3.000 or more.

Regarding the conductive film 12, a refractive index $n_{\lambda 600\text{-}700\ nm}$ is 4.300 or less, and an extinction coefficient $k_{\lambda 600\text{-}700\ nm}$ is 4.500 or less, at a wavelength of 600 nm to 700 nm.

In the case where the refractive index $n_{\lambda 600\text{-}700\ nm}$ and the extinction coefficient $k_{\lambda 600\text{-}700\ nm}$ are in the above-described ranges, the conductive film 12 has a high light transmittance at the wavelength of 600 nm to 700 nm. Therefore, the above-described ranges are preferred when a He:Ne laser having a wavelength of 632 nm is used to reduce the deformation of the substrate.

The light transmittance of the conductive film 12 at the wavelength of 600 nm to 700 nm is preferably 1.0% or more, and more preferably 1.5% or more. The upper limit of the light transmittance of the conductive film 12 at the wavelength of 600 nm to 700 nm is not particularly limited, and is, for example, 2.5% or less.

The refractive index $n_{\lambda 600\text{-}700\ nm}$ of the conductive film 12 is preferably 4.200 or less. The lower limit of the refractive index $n_{\lambda 600\text{-}700\ nm}$ of the conductive film 12 is not particularly limited, and is, for example, 3.100 or more.

The extinction coefficient $k_{\lambda 600\text{-}700\ nm}$ of the conductive film 12 is preferably 4.400 or less. The upper limit of the extinction coefficient $k_{\lambda 600\text{-}700\ nm}$ of the conductive film 12 is not particularly limited, and is, for example, 2.500 or more.

Regarding the conductive film 12 in the first aspect of the EUV mask blank according to the present embodiment, a refractive index $n_{\lambda 400\text{-}500\ nm}$ is 2.500 or more, and an extinction coefficient $k_{\lambda 400\text{-}500\ nm}$ is 0.440 or more, at a wavelength of 400 nm to 500 nm.

Regarding the conductive film 12 in the second aspect of the EUV mask blank according to the present embodiment, a refractive index $n_{\lambda 400\text{-}500\ nm}$ is preferably 2.500 or more, and an extinction coefficient $k_{\lambda 400\text{-}500\ nm}$ is preferably 0.440 or more, at a wavelength of 400 nm to 500 nm.

In the case where the refractive index $n_{\lambda 400\text{-}500\ nm}$ and the extinction coefficient $k_{\lambda 400\text{-}500\ nm}$ are in the above-described ranges, the conductive film 12 has a low light transmittance at the wavelength of 400 nm to 500 nm. Therefore, the above-described ranges are preferred when an Ar laser having a wavelength of 488 nm is used for the defect inspection.

The light transmittance of the conductive film 12 at the wavelength of 400 nm to 500 nm is preferably 1.0% or less, and more preferably less than 1.0%. The lower limit of the light transmittance of the conductive film 12 at the wavelength of 400 nm to 500 nm is not particularly limited, and is, for example, 0.7% or more.

The refractive index $n_{\lambda 400\text{-}500\ nm}$ of the conductive film 12 is preferably 2.600 or more, more preferably 2.650 or more, and still more preferably 2.700 or more. The upper limit of the refractive index $n_{\lambda 400\text{-}500\ nm}$ of the conductive film 12 is not particularly limited, and is, for example, 3.300 or less.

The extinction coefficient $k_{\lambda 400\text{-}500\ nm}$ of the conductive film 12 is preferably 0.500 or more, more preferably 1.000 or more, still more preferably 1.500 or more, and particularly preferably 1.800 or more. The upper limit of the extinction coefficient $k_{\lambda 400\text{-}500\ nm}$ of the conductive film 12 is not particularly limited, and is, for example, 4.300 or less.

Regarding the conductive film 12 in the first aspect of the EUV mask blank according to the present embodiment, a refractive index $n_{\lambda 480\text{-}500\ nm}$ is preferably 2.500 or more, and an extinction coefficient $k_{\lambda 480\text{-}500\ nm}$ is preferably 0.440 or more, at a wavelength of 480 nm to 500 nm.

Regarding the conductive film 12 in the second aspect of the EUV mask blank according to the present embodiment, a refractive index $n_{\lambda 480\text{-}500\ nm}$ is 2.500 or more, and an extinction coefficient $k_{\lambda 480\text{-}500\ nm}$ is 0.440 or more, at a wavelength of 480 nm to 500 nm.

The refractive index $n_{\lambda 480\text{-}500\ nm}$ of the conductive film 12 is preferably 2.600 or more, more preferably 2.700 or more, and still more preferably 2.800 or more. The upper limit of the refractive index $n_{\lambda 480\text{-}500\ nm}$ of the conductive film 12 is not particularly limited, and is, for example, 3.300 or less.

The extinction coefficient $k_{\lambda 480\text{-}500\ nm}$ of the conductive film 12 is preferably 0.500 or more, more preferably 1.000 or more, still more preferably 1.500 or more, particularly preferably 2.000 or more, and most preferably 2.200 or more. The upper limit of the extinction coefficient $k_{\lambda 480\text{-}500\ nm}$ of the conductive film 12 is not particularly limited, and is, for example, 4.300 or less.

Regarding the conductive film 12, a film thickness t is 20 nm to 350 nm.

When the film thickness t is 20 nm or more, the light transmittance at the wavelength of 400 nm to 500 nm can be sufficiently reduced.

In the case where the film thickness t exceeds 350 nm, the light transmittance at the wavelength of 1000 nm to 1100 nm is not sufficiently high even in the case where the refractive index $n_{\lambda 1000\text{-}1100\ nm}$ and the extinction coefficient $k_{\lambda 1000\text{-}1100\ nm}$ satisfy the above-described ranges. In addition, the light transmittance at the wavelength of 600 nm to 700 nm is not sufficiently high even in the case where the refractive index $n_{\lambda 600\text{-}700\ nm}$ and the extinction coefficient $k_{\lambda 600\text{-}700\ nm}$ satisfy the above-described ranges.

The film thickness t of the conductive film 12 is preferably 20 nm or more, more preferably 25 nm or more, and still more preferably 30 nm or more. The film thickness t of the conductive film 12 is preferably 300 nm or less, more preferably 200 nm or less, and still more preferably 100 nm or less.

The conductive film 12 in which the refractive index $n_{\lambda 1000\text{-}1100\ nm}$, the refractive index $n_{\lambda 600\text{-}700\ nm}$, and the refractive index $n_{\lambda 400\text{-}500\ nm}$ satisfy the above-described ranges, and the extinction coefficient $k_{\lambda 1000\text{-}1100\ nm}$, the extinction coefficient $k_{\lambda 600\text{-}700\ nm}$, and the extinction coefficient $k_{\lambda 400\text{-}500\ nm}$ satisfy the above-described ranges contains at least one of nitrogen (N) and boron (B).

The conductive film 12 in which the refractive index $n_{\lambda 1000\text{-}1100\ nm}$, the refractive index $n_{\lambda 600\text{-}700\ nm}$, and the refractive index $n_{\lambda 480\text{-}500\ nm}$ satisfy the above-described ranges, and the extinction coefficient $k_{\lambda 1000\text{-}1100\ nm}$, the extinction coefficient $k_{\lambda 600\text{-}700\ nm}$, and the extinction coefficient $k_{\lambda 480\text{-}500\ nm}$ satisfy the above-described ranges contains at least one of nitrogen (N) and boron (B).

The conductive film 12 contains at least one of nitrogen (N) and boron (B). That is, the total content of N and B contained in the conductive film 12 is more than 0 at %. Accordingly, the conductive film 12 can be made amorphous. The total content of N and B is preferably 2 at % or more, more preferably 5 at % or more, and still more preferably 10 at % or more.

From the viewpoint of the resistivity of the conductive film, the total content of N and B is 65 at % or less, preferably 60 at % or less, and more preferably 40 at % or less. That is, the total content of N and B is more than 0 at % and 65 at % or less.

From the above-described same viewpoint, in the case where N is contained in the conductive film 12, the content of N is preferably more than 0 at %, more preferably 2 at % or more, still more preferably 5 at % or more, and yet still more preferably 10 at % or more. In the case where N is contained in the conductive film 12, the content of N is preferably 65 at % or less, more preferably 60 at % or less, and still more preferably 40 at % or less.

From the above-described same viewpoint, in the case where B is contained in the conductive film 12, the content of B is preferably more than 0 at %, more preferably 5 at % or more, still more preferably 10 at % or more, and yet still more preferably 15 at % or more. In the case where B is contained in the conductive film 12, the content of B is preferably 65 at % or less, more preferably 50 at % or less, still more preferably 40 at % or less, particularly preferably 35 at % or less, and most preferably 30 at % or less.

The conductive film 12 preferably further contains at least one of tantalum (Ta) and chromium (Cr). Specific examples thereof include a TaN film containing Ta and N, a TaB film containing Ta and B, a CrN film containing Cr and N, and a CrB film containing Cr and B. Among them, the TaN film is preferred because the TaN film has a high hardness and a large film stress.

In the case where the TaN film is used as the conductive film 12, the content of N in the TaN film of more than 0 at % is preferred because the hardness of the TaN film with respect to the substrate 11 is improved. The content of N is more preferably 2 at % or more, still more preferably 10 at % or more, and particularly preferably 15 at % or more. The content of N in the TaN film of 65 at % or less is preferred because the surface smoothness of the TaN film is improved and the sheet resistance value of the TaN film is reduced. The content of N is more preferably 60 at % or less, and still more preferably 55 at % or less.

In the case where the TaB film is used as the conductive film 12, the content of B in the TaB film of more than 0 at % is preferred because the film adhesion is improved and the surface smoothness is improved. The content of B is more preferably 5 at % or more, more preferably 10 at % or more, still more preferably 15 at % or more, and most preferably 20 at % or more. The content of B in the TaB film of 35 at % or less is preferred because the hardness is improved, and the content of B is more preferably 30 at % or less.

In the case where the CrN film is used as the conductive film 12, the content of N in the CrN film of more than 0 at % is preferred because the hardness of the CrN film with respect to the substrate 11 is improved. The content of N is more preferably 1 at % or more, and still more preferably 2 at % or more. The content of N in the CrN film of 65 at % or less is preferred because the surface smoothness of the CrN film is improved, and the sheet resistance value of the CrN film is reduced. The content of Nis more preferably 50 at % or less, still more preferably 30 at % or less, and particularly preferably 15 at % or less.

A laminated film including the TaN film and the CrN film may be used as the conductive film 12. The laminated film having the above-described configuration contains the TaN film, so that the hardness of the film is high and the film stress is large.

In the case where the laminated film having the above-described configuration is used, it is preferable to use a laminated film in which the TaN film and the CrN film are laminated in this order from the substrate 11 side. Note that the total film thickness of the laminated film satisfies the above-described film thickness of the conductive film 12 in the case where the laminated film having the above-described configuration is used. In addition, the content of N in the TaN film and the content of N in the CrN film satisfy the above-described ranges, respectively.

In addition, an upper layer may be further provided on or above the conductive film 12. The upper layer is preferably a film containing chromium (Cr) and at least one element selected from the group consisting of nitrogen (N) and oxygen (O). By further providing the upper layer on or above the conductive film 12, mechanical characteristics can be improved and a change in optical characteristics due to the formation of a natural oxide film can be prevented.

In the case where the CrO film is used as the upper layer of the conductive film 12, the content of O in the CrO film of 5 at % or more is preferred because the hardness of the CrO film is improved. The content of O is more preferably 8 at % or more, and still more preferably 10 at % or more. The content of O in the CrO film of 30 at % or less is preferred because the surface smoothness of the CrO film is improved and the sheet resistance value of the CrO film is reduced. The content of O is more preferably 25 at % or less, still more preferably 20 at % or less, and particularly preferably 15 at % or less.

The film thickness t' of the upper layer of the conductive film 12 is preferably 5 nm or more, more preferably 10 nm or more, still more preferably 15 nm or more, and particularly preferably 20 nm or more. The film thickness t' of the upper layer of the conductive film 12 is preferably 100 nm or less, more preferably 70 nm or less, and still more preferably 50 nm or less.

In the case where the conductive film 12 contains Ta, among diffraction peaks derived from the conductive film 12 observed by an out-of-plane XRD method, the full width at half maximum (FWHM) of a diffraction peak attributed to a bcc (110) plane of Ta is preferably 1.5° to 4.0°. In the case where the full width at half maximum (FWHM) is 1.5° or more, crystallization of the conductive film is prevented, and the smoothness of the surface of the conductive film 12 is increased. The full width at half maximum (FWHM) is more preferably 2.0° or more, and still more preferably 3.0° or more.

On the other hand, in the case where the full width at half maximum (FWHM) is 4.0° or less, the crystallinity of the conductive film is not too low, and thus the hardness of the film is not decreased. Therefore, the deterioration of the overlay accuracy by the wear by repeated use is prevented.

The resistivity of the conductive film 12 is 3.5 mΩ·cm or less. Generally, the fixing force of the EUV mask to the exposure device is improved as the resistivity of the conductive film 12 is reduced. In the present embodiment, the resistivity of the conductive film 12 is as low as 3.5 mΩ·cm or less, and thus an excellent fixing force is obtained when the EUV mask is fixed to the exposure device. The resistivity of the conductive film 12 is preferably 1.0 mΩ·cm or less, more preferably 0.320 mΩ·cm or less, still more preferably 0.300 mΩ·cm or less, and particularly preferably 0.250 mΩ·cm or less.

The lower limit of the resistivity of the conductive film 12 is not particularly limited, and is preferably 0.050 mΩ·cm or more, more preferably 0.060 mΩ·cm or more, and still more preferably 0.065 mΩ·cm or more.

The resistivity of the conductive film 12 is measured by a resistivity meter, and the detailed measurement conditions are in accordance with a measurement method in the following Examples.

In order to set the resistivity of the conductive film 12 in the above range, a method of adjusting a content of nitrogen or boron contained in the conductive film may be used. Note that, in the case where the upper layer is further provided on or above the conductive film 12 and the resistivity of the conductive film is sufficiently lower than that of the upper layer, the resistivity during lamination can be regarded as the resistivity of the conductive film. Examples of a combination of the conductive film and the upper layer in which the resistivity of the conductive film is sufficiently lower than that of the upper layer include a combination of a TaN film as the conductive film and a CrO film as the upper layer.

It is preferable that the conductive film 12 have a low sheet resistance value because the chucking force generated by the electrostatic chuck is increased. The sheet resistance value of the conductive film 12 is preferably 250 Ω/sq. or less, more preferably 200 Ω/sq. or less, still more preferably 150 Ω/sq. or less, yet still more preferably 100 Ω/sq. or less, and particularly preferably 80 Ω/sq. or less.

In addition, the sheet resistance value of the conductive film 12 is preferably 0.1 Ω/sq. or more, more preferably 0.5 Ω/sq. or more, and still more preferably 1.0 Ω/sq. or more.

It is preferable that the conductive film 12 have a small surface roughness because adhesion to the electrostatic chuck is improved. The surface roughness of the conductive film 12 is preferably 0.600 nm or less, more preferably 0.400 nm or less, still more preferably 0.200 nm or less, particularly preferably 0.150 nm or less, and most preferably 0.100 nm or less in terms of Rq (root mean square height, JIS B0601: 2013). The surface roughness of the conductive film 12 is preferably 0.030 nm or more, more preferably 0.050 nm or more, and still more preferably 0.070 nm or more in terms of Rq. In the case where the gas pressure of a gas used for forming the conductive film is 0.3 Pa or more, the surface roughness of the conductive film tends to increase.

It is preferable that the conductive film 12 have a high surface hardness because the generation of particles due to rubbing with the electrostatic chuck is prevented. The surface hardness of the conductive film 12 is preferably 10.0 GPa or more.

In addition, the surface hardness of the conductive film 12 is preferably 16.0 GPa or less, more preferably 14.0 GPa or less, and still more preferably 12.0 GPa or less. Here, a method of measuring the surface hardness of the conductive film 12 is not particularly limited, and a known method, specifically, for example, a Vickers hardness test, a Rockwell hardness test, a Brinell hardness test, and a nano-indentation test can be used. Among them, the nano-indentation test is widely used when the surface hardness of a thin film is measured.

In the case where the TaN film, the CrN film, or a laminated film including the CrN film and the TaN film is used as the conductive film 12, the surface hardness of the conductive film 12 is high, and the surface hardness is 10.0 GPa or more.

In the EUV mask blank 10 illustrated in the FIGURE, film stress is generated in the reflective layer 13 and the absorption layer 14 formed on or above the front surface of the substrate 11. Film stress is also generated in the conductive film 12 formed on or above the back surface of the substrate 11. In the EUV mask blank, stress generated on or above the front surface of the substrate 11 and stress generated on or above the back surface of the substrate 11 cancel each other out, and as a result, deformation of the substrate caused by application of stress is prevented.

In the case of preventing the deformation of the substrate in an EUV mask blank having the following configuration as an example of the EUV mask blank, the flatness of the substrate with a conductive film in which the conductive film 12 is formed on or above the back surface of the substrate 11 is preferably 500 nm or less, more preferably 400 nm or less, and still more preferably 300 nm or less.

(Configuration)
Substrate: $SiO_2$—$TiO_2$ glass substrate (outer shape: 152 mm square, thickness: 6.3 mm)
Reflective layer: Si/Mo multilayer reflective film (a Si film (4.5 nm) and a Mo film (2.3 nm) are alternately laminated in 40 cycles (total film thickness: 272 nm).)
Absorption layer: TaNH film (film thickness: 60 nm)

In the case where the TaN film, the TaB film, or a laminated film including the CrN film and the TaN film is used as the conductive film 12, the film stress of the conductive film 12 is large, and the flatness of the substrate with a conductive film is 500 nm or less.

In the case where an EUV mask is produced from an EUV mask blank, a heat treatment may be performed as a pre-treatment. By this heat treatment, the film stress of the reflective layer 13 and the absorption layer 14 formed on or above the front surface of the substrate 11 is reduced by the relaxation of the film stress. In addition, the film stress of the conductive film 12 formed on or above the back surface of the substrate 11 is reduced by the relaxation of the film stress. In the case where the stress is reduced by the relaxation of the film stress, the deformation of the substrate 11 cannot be prevented, and a pattern formed on the EUV mask produced using the EUV mask blank may be displaced.

It is preferable that the conductive film 12 have less relaxation of the film stress due to the heat treatment. A difference in the flatness between the substrates with conductive films measured before and after the heat treatment can be used as an index of the relaxation of the film stress due to the heat treatment. In the case where the substrate with a conductive film in which the conductive film 12 is formed on or above the back surface of the substrate 11 is subjected to a heat treatment at 136° C. for 20 minutes, the thermal relaxation rate of the flatness (warpage) of the substrate with a conductive film measured before and after the heat treatment and determined by the following formula is preferably 15% or less, more preferably 12% or less, and still more preferably 10% or less. The lower limit of the thermal relaxation rate of the flatness (warpage) is not particularly limited, and is, for example, 1.0% or more.

Thermal relaxation rate (%) of flatness={(flatness of substrate with TaN conductive film before heat treatment−flatness of substrate with TaN conductive film after heat treatment)/flatness of substrate with TaN conductive film before heat treatment}×100

The above-described flatness is measured using a flatness measuring machine manufactured by Fujinon Corporation.

The conductive film 12 can be formed by a known film-forming method, for example, a sputtering method such as a magnetron sputtering method and an ion beam sputtering method.

For example, in the case where the TaN film is formed as the conductive film 12 by the sputtering method, the sputtering method may be performed using a Ta target in an atmosphere containing nitrogen ($N_2$) and an inert gas containing at least one of helium (He), argon (Ar), neon (Ne), krypton (Kr), and xenon (Xe). In the case where the magnetron sputtering method is used, the method may be performed under the following film-forming conditions specifically.

(Film-Forming Conditions)
Target: Ta target
Sputtering gas: a mixed gas of Ar and $N_2$ ($N_2$ gas concentration: preferably 2 vol % to 50 vol %, more preferably 2 vol % to 40 vol %, and still more preferably 2 vol % to 30 vol %, gas pressure: preferably $1\times10^{-1}$ Pa to $3\times10^{-1}$ Pa, more preferably $1\times10^{-1}$ Pa to $2\times10^{-1}$ Pa, and still more preferably $1\times10^{-1}$ Pa to $1.5\times10^{-1}$ Pa.)

Supplied electric power: preferably 300 W to 1500 W, and more preferably 500 W to 1000 W Film-forming rate: preferably 0.010 nm/sec to 0.200 nm/sec, and more preferably 0.050 nm/sec to 0.100 nm/sec For example, in the case where the TaB film is formed as the conductive film 12 by the sputtering method, the sputtering method may be performed using a Ta target and a B target or a TaB compound target in an atmosphere containing an inert gas containing at least one of helium (He), argon (Ar), neon (Ne), krypton (Kr), and xenon (Xe). In the case where the magnetron sputtering method is used, the method may be performed under the following film-forming conditions specifically.

(Film-Forming Conditions)

Target: Ta target and B target, or TaB compound target
Sputtering gas: Ar gas (Gas pressure: preferably $1.0\times10^{-1}$ Pa to $5.0\times10^{-1}$ Pa, more preferably $1.0\times10^{-1}$ Pa to $4.0\times10^{-1}$ Pa, and still more preferably $1.0\times10^{-1}$ Pa to $3.0\times10^{-1}$ Pa.)

Supplied electric power: preferably 300 W to 1500 W, and more preferably 500 W to 1000 W Film-forming rate: preferably 0.010 nm/sec to 0.200 nm/sec, and more preferably 0.010 nm/sec to 0.100 nm/sec For example, in the case where the CrN film is formed as the conductive film 12 by the sputtering method, the sputtering method may be performed using a Cr target in an atmosphere containing nitrogen ($N_2$) and an inert gas containing at least one of helium (He), argon (Ar), neon (Ne), krypton (Kr), and xenon (Xe). In the case where the magnetron sputtering method is used, the method may be performed under the following film-forming conditions specifically.

(Film-Forming Conditions)

Target: Cr target
Sputtering gas: a mixed gas of Ar and $N_2$ ($N_2$ gas concentration: preferably 20 vol % to 60 vol %, more preferably 30 vol % to 60 vol %, and still more preferably 40 vol % to 60 vol %, gas pressure: preferably $1\times10^{-1}$ Pa to $3\times10^{-1}$ Pa, more preferably $1\times10^{-1}$ Pa to $2\times10^{-1}$ Pa, and still more preferably $1\times10^{-1}$ Pa to $1.5\times10^{-1}$ Pa.) Supplied electric power: preferably 300 W to 2000 W, and more preferably 500 W to 2000 W Film-forming rate: preferably 0.010 nm/sec to 0.200 nm/sec, and more preferably 0.050 nm/sec to 0.200 nm/sec For example, in the case where the CrO film is formed as an upper layer on or above the conductive film 12 by the sputtering method, the sputtering method may be performed using a Cr target in an atmosphere containing oxygen ($O_2$) and an inert gas containing at least one of helium (He), argon (Ar), neon (Ne), krypton (Kr), and xenon (Xe). In the case where the magnetron sputtering method is used, the method may be performed under the following film-forming conditions specifically.

(Film-Forming Conditions)

Target: Cr target
Sputtering gas: a mixed gas of Ar and $O_2$ ($O_2$ gas concentration: preferably 10 vol % to 40 vol %, more preferably 20 vol % to 40 vol %, and still more preferably 30 vol % to 40 vol %, gas pressure: preferably $1\times10^{-1}$ Pa to $2.0\times10^{-1}$ Pa, more preferably $1\times10^{-1}$ Pa to $1.8\times10^{-1}$ Pa, and still more preferably $1\times10^{-1}$ Pa to $1.6\times10^{-1}$ Pa.)

Supplied electric power: preferably 300 W to 1000 W, and more preferably 500 W to 1000 W Film-forming rate: preferably 0.010 nm/sec to 0.200 nm/sec, and more preferably 0.050 nm/sec to 0.200 nm/sec The reflective layer 13 is not particularly limited as long as it has desired characteristics as a reflective layer of an EUV mask blank. Here, a characteristic particularly required for the reflective layer 13 is a high EUV light reflectance. Specifically, when the surface of the reflective layer 13 is irradiated with a light beam in the wavelength region of EUV light at an incident angle of 6 degrees, the maximum value of the light reflectance in a vicinity of a wavelength of 13.5 nm is preferably 60% or more, and more preferably 65% or more.

In order to achieve a high EUV light reflectance, a multilayer reflective film in which a high-refractive-index layer and a low-refractive-index layer are alternately laminated a plurality of times is generally used as the reflective layer 13. In the multilayer reflective film constituting the reflective layer 13, Mo is widely used for the high-refractive-index layer, and Si is widely used for the low-refractive-index layer. That is, a Mo/Si multilayer reflective film is the most common. However, the multilayer reflective film is not limited thereto, and an Ru/Si multilayer reflective film, an Mo/Be multilayer reflective film, an Mo compound/Si compound multilayer reflective film, an Si/Mo/Ru multilayer reflective film, an Si/Mo/Ru/Mo multilayer reflective film, and an Si/Ru/Mo/Ru multilayer reflective film can also be used.

The film thickness of each layer constituting the multilayer reflective film constituting the reflective layer 13 and the number of repeating units of the layer can be appropriately selected according to the film material to be used and the EUV light reflectance required for the reflective layer. When taking the Mo/Si multilayer reflective film as an example, in order to obtain the reflective layer 13 having the maximum value of the EUV light reflectance of 60% or more, the multilayer reflective film may be formed by laminating a Mo layer having a film thickness of 2.3 nm±0.1 nm and a Si layer having a film thickness of 4.5 nm±0.1 nm such that the number of repeating units is 30 to 60.

Each of the layers constituting the multilayer reflective film constituting the reflective layer 13 may be formed in a desired thickness using a known film-forming method such as a magnetron sputtering method or an ion beam sputtering method. For example, in the case where the Si/Mo multilayer reflective film is formed by using the ion beam sputtering method, it is preferable that a Si film is formed to have a thickness of 4.5 nm at an ion acceleration voltage of 300 V to 1500 V and a film-forming rate of 0.030 nm/sec to 0.300 nm/sec by using a Si target as a target and an Ar gas (gas pressure of $1.3\times10^{-2}$ Pa to $2.7\times10^{-2}$ Pa) as a sputtering gas, and next, a Mo film is formed to have a thickness of 2.3 nm at an ion acceleration voltage of 300 V to 1500 V and a film-forming rate of 0.030 nm/sec to 0.300 nm/sec by using a Mo target as a target and an Ar gas (gas pressure of $1.3\times10^{-2}$ Pa to $2.7\times10^{-2}$ Pa) as a sputtering gas. The Si/Mo multilayer reflective film is formed by laminating the Si film and the Mo film for 40 cycles to 50 cycles with the above steps as one cycle.

A characteristic particularly required for the absorption layer 14 is an extremely low EUV light reflectance. Specifically, the maximum light reflectance in a vicinity of a wavelength of 13.5 nm when the surface of the absorption layer 14 is irradiated with a light beam in the wavelength region of EUV light is preferably 5% or less, more preferably 3% or less, and still more preferably 1% or less.

In order to achieve the above characteristic, the absorption layer 14 is made of a material having a high EUV light absorption coefficient. As the material having a high EUV light absorption coefficient, a material containing tantalum (Ta) as a main component is preferably used. In the present description, a material containing tantalum (Ta) as a main component means a material containing 20 at % or more of Ta in the material. The absorption layer 14 preferably contains Ta in an amount of 30 at % or more, more preferably in an amount of 35 at % or more, still more preferably in an amount of 40 at % or more, particularly preferably in an amount of 45 at % or more, and most preferably in an amount of 50 at % or more.

The material containing Ta as a main component used for the absorption layer 14 preferably contains, in addition to Ta, at least one component of hafnium (Hf), silicon (Si), zirconium (Zr), germanium (Ge), boron (B), palladium (Pd), tin (Sn), chromium (Cr), manganese (Mn), iron (Fe), cobalt (Co), silver (Ag), cadmium (Cd), indium (In), antimony (Sb), tungsten (W), rhenium (Re), osmium (Os), iridium (Ir), platinum (Pt), gold (Au), thallium (TI), lead (Pb), bismuth (Bi), carbon (C), titanium (Ti), zirconium (Zr), molybdenum (Mo), ruthenium (Ru), rhodium (Rh), palladium (Pd), calcium (Ca), magnesium (Mg), aluminum (Al), nickel (Ni), copper (Cu), zinc (Zn), gallium (Ga), arsenic (As), selenium (Se), tellurium (Te), hydrogen (H), and nitrogen (N).

Specific examples of the material containing the above-described elements other than Ta include TaN, TaNH, TaHf, TaHfN, TaBSi, TaBSiN, TaB, TaBN, TaSi, TaSiN, TaGe, TaGeN, TaZr, TaZrN, TaPd, TaSn, TaPdN, TaSn, TaCr, TaMn, TaFe, TaCo, TaAg, TaCd, TaIn, TaSb, and TaW.

The absorption layer 14 having the above-described configuration can be formed using a film-forming method such as a sputtering method, for example, a magnetron sputtering method and an ion beam sputtering method.

For example, in the case where a TaNH film is formed as the absorption layer 14 by using the magnetron sputtering method, it is preferable that the film is formed to have a thickness of 20 nm to 90 nm at a supplied electric power of 300 W to 2000 W and a film-forming rate of 0.5 nm/min to 60 nm/min by using a Ta target as a target and using a mixed gas of Ar, $N_2$, and $H_2$ ($H_2$ gas concentration: 1 vol % to 30 vol %, $N_2$ gas concentration: 5 vol % to 75 vol %, Ar gas concentration: 10 vol % to 94 vol %, gas pressure: $0.5\times10^{-1}$ Pa to 1.0 Pa) as a sputtering gas.

The EUV mask blank 10 according to the present embodiment may have a configuration other than the configuration illustrated in the FIGURE, that is, the substrate 11, the conductive film 12, the reflective layer 13, and the absorption layer 14.

In the EUV mask blank according to the present embodiment, a protective layer may be formed between the reflective layer 13 and the absorption layer 14. The protective layer is provided for the purpose of protecting the reflective layer 13 so that the reflective layer 13 is not damaged by an etching process when a pattern is formed on the absorption layer 14 by the etching process, generally a dry etching process. Accordingly, as a material of the protective layer, a material which is hardly affected by the etching process for the absorption layer 14, that is, a material which has a slower etching rate than the absorption layer 14 and is hardly damaged by the etching process is selected. In order to satisfy the above-described characteristics, the protective layer is preferably made of a material containing ruthenium (Ru). Specific examples of the material containing Ru include Ru and Ru compounds (RuB, RuSi, RuNb, RuTi, RuY, RuZr, RuLa, and the like). The material containing Ru is preferably a material containing Ru in an amount of 40.0 at % or more, more preferably a material containing Ru in an amount of 50.0 at % or more, and still more preferably a material containing Ru in an amount of 55.0 at % or more.

In the case where the protective layer is formed, the thickness of the protective layer is preferably 1 nm to 20 nm, and more preferably 1 nm to 5 nm.

In the case where the protective layer is formed, the film is formed by using a known film-forming method such as a magnetron sputtering method and an ion beam sputtering method. In the case where the Ru film is formed by the magnetron sputtering method, it is preferable that the Ru film is formed to have a thickness of 2 nm to 5 nm at a supplied electric voltage of 30 V to 1500 V and a film-forming rate of 0.020 nm/sec to 1.000 nm/sec by using a Ru target as a target and using an Ar gas (gas pressure: $1.0\times10^{-2}$ Pa to $10\times10^{-1}$ Pa) as a sputtering gas.

Even in the case where the protective layer is provided on or above the reflective layer 13, the maximum value of the light reflectance in a vicinity of a wavelength of 13.5 nm is preferably 60% or more, more preferably 63% or more, and still more preferably 65% or more.

Furthermore, in the EUV mask blank according to the present embodiment, a low-reflection layer for inspection light used for inspection of a mask pattern may be formed on or above the absorption layer 14.

The low-reflection layer is formed of a film having low reflection under the inspection light used for the inspection of the mask pattern. In the case where an EUV mask is produced, after a pattern is formed on the absorption layer, whether the pattern is formed as designed is inspected. In the inspection of the mask pattern, an inspection machine using a light of about 257 nm as the inspection light is generally used. That is, the inspection is performed based on a difference in reflectance of the light of about 257 nm, specifically, a difference in reflectance between a surface exposed by removing the absorption layer in the pattern formation and a surface of the absorption layer remaining without being removed in the pattern formation.

Here, the former is a surface of the reflective layer or a surface of the protective layer, and is generally the surface of the protective layer. Accordingly, in the case where the difference in reflectance between the surface of the reflective layer or the surface of the protective layer and the surface of the absorption layer for the wavelength of the inspection light is small, the contrast during the inspection deteriorates, and accurate inspection cannot be performed. In the case where the difference in reflectance between the surface of the reflective layer or the surface of the protective layer and the surface of the absorption layer for the wavelength of the inspection light is small, the contrast during the inspection is good due to the formation of the low-reflection layer. In the case where the low-reflection layer is formed on or above the absorption layer, the low-reflection layer preferably has a maximum light reflectance of 15% or less, more preferably 10% or less, and still more preferably 5% or less at the wavelength of the inspection light when a surface of the low-reflection layer is irradiated with a light in the wavelength region of the inspection light.

In order to achieve the above-described characteristics, the low-reflection layer is preferably made of a material having a lower refractive index at the wavelength of the inspection light than that of the absorption layer.

The low-reflection layer satisfying this characteristic may contain at least one selected from the group consisting of tantalum (Ta), palladium (Pd), chromium (Cr), silicon (Si), and hafnium (Hf), and at least one selected from the group consisting of oxygen (O) and nitrogen (N). Preferred examples of such a low-reflection layer include a TaPdO layer, a TaPdON layer, a TaON layer, a CrO layer, a CrON layer, a SiON layer, a SiN layer, a HfO layer, and a HfON layer.

A total content of Ta, Pd, Cr, Si, and Hf in the low-reflection layer is preferably 10 at % to 55 at %, particularly 10 at % to 50 at %, because the optical characteristics for the wavelength region of the inspection light for the pattern can be controlled.

In addition, a total content of O and N in the low-reflection layer is preferably 45 at % to 90 at %, particularly 50 at % to 90 at % because the optical characteristics for the wavelength region of the inspection light for the pattern can be controlled. A total content of Ta, Pd, Cr, Si, Hf, O, and N in the low-reflection layer is preferably 95 at % to 100 at %, more preferably 97 at % to 100 at %, and still more preferably 99 at % to 100 at %.

The low-reflection layer having the above-described configuration can be formed by performing the sputtering method using a target containing at least one of Ta, Pd, Cr, Si, and Hf. Here, as the target, any of the above-described two or more kinds of metal targets and compound targets can be used.

The use of two or more kinds of metal targets is convenient for adjusting the constituent components of the low-reflection layer. In the case where two or more kinds of metal targets are used, the constituent components of the absorption layer can be adjusted by adjusting a supplied electric power to the targets. On the other hand, in the case where the compound target is used, the target composition is preferably adjusted in advance so that the low-reflection layer to be formed has a desired composition.

The sputtering method using the above-described target can be performed in an inert gas atmosphere as in the sputtering method for forming the absorption layer.

However, in the case where the low-reflection layer contains oxygen (O), the sputtering method is performed in an inert gas atmosphere containing $O_2$ and at least one of He, Ar, Ne, Kr, and Xe. In the case where the low-reflection layer contains N, the sputtering method is performed in an inert gas atmosphere containing $N_2$ and at least one of He, Ar, Ne, Kr, and Xe. In the case where the low-reflection layer contains O and N, the sputtering method is performed in an inert gas atmosphere containing $O_2$ and $N_2$ and at least one of He, Ar, Ne, Kr, and Xe.

The specific conditions for performing the sputtering method vary depending on the target to be used and the composition of the inert gas atmosphere for performing the sputtering method, and the sputtering method may be performed under the following conditions in any case.

In the case where the inert gas atmosphere is a mixed gas atmosphere of Ar and $O_2$, the conditions for forming the low-reflection layer are as follows.
(Conditions for Forming Low-Reflection Layer)

Gas pressure: $1.0 \times 10^{-1}$ Pa to $50 \times 10^{-1}$ Pa, preferably $1.0 \times 10^{-1}$ Pa to $40 \times 10^{-1}$ Pa, and more preferably $1.0 \times 10^{-1}$ Pa to $30 \times 10^{-1}$ Pa Sputtering gas: a mixed gas of Ar and $O_2$ ($O_2$ gas concentration: 3 vol % to 80 vol %, preferably 5 vol % to 60 vol %, more preferably 10 vol % to 40 vol %)

Supplied electric power: 30 W to 1000 W, preferably 50 W to 750 W, more preferably 80 W to 500 W Film-forming rate: 0.01 nm/min to 60 nm/min, preferably 0.05 nm/min to 45 nm/min, more preferably 0.1 nm/min to 30 nm/min In the case where an inert gas or a plurality of inert gases other than Ar are used, the total concentration of the inert gases is set within the same concentration range as the above-described Ar gas concentration. In addition, in the case where the inert gas atmosphere contains $N_2$, the $N_2$ concentration is set within the same concentration range as the above-described oxygen concentration, and in the case where the inert gas atmosphere contains $N_2$ and $O_2$, the total concentration thereof is set within the same concentration range as the above-described oxygen concentration.

In the EUV mask blank according to the present embodiment, it is preferable to form the low-reflection layer on or above the absorption layer because a wavelength of the inspection light for a pattern and a wavelength of the EUV light are different. Accordingly, in the case where EUV light (in a vicinity of 13.5 nm) is used as the inspection light for the pattern, it is considered that it is not necessary to form the low-reflection layer on or above the absorption layer. It is also considered that the wavelength of the inspection light tends to shift to a short wavelength side as the pattern dimension is reduced, and may shift to 193 nm and further to 13.5 nm in the future. In the case where the wavelength of the inspection light is 13.5 nm, it is considered that it is not necessary to form the low-reflection layer on or above the absorption layer.

In the EUV mask blank according to the present embodiment, on or above the absorption layer 14 (on or above the absorption layer in the case where the low-reflection layer is formed on the absorption layer), a hard mask layer described in JP2009-54899A or JP2009-21582A, that is, a layer formed of a material having resistance for the etching conditions of the absorption layer (the absorption layer and the low-reflection layer in the case where the low-reflection layer is formed on or above the absorption layer) may be formed. A resist can be thinned by forming such a hard mask layer and increasing the etch selectivity between the hard mask layer and the absorption layer (the absorption layer and the low-reflection layer in the case where the low-reflection layer is formed on or above the absorption layer) under the etching conditions of the absorption layer (the absorption layer and the low-reflection layer in the case where the low-reflection layer is formed on or above the absorption layer), specifically, a ratio of an etching rate of the absorption layer (an etching rate of the absorption layer and the low-reflection layer in the case where the low-reflection layer is formed on or above the absorption layer) under the etching conditions of the absorption layer (the absorption layer and the low-reflection layer in the case where the low-reflection layer is formed on or above the absorption layer) to an etching rate of the hard mask layer.

Next, a substrate with a conductive film according to the present embodiment will be described. The substrate with the conductive film according to the present embodiment has a conductive film on or above the substrate. Here, the substrate and the conductive film are the same as the substrate and the conductive film in the EUV mask blank according to the present embodiment. That is, the EUV mask blank according to the present embodiment is obtained by forming a reflective layer and an absorption layer on or above a surface opposite to a surface of the substrate with the conductive film according to the present embodiment on or above which the conductive film is provided.

As described above, the following configurations are disclosed in the present description.

(1) A reflective mask blank for EUV lithography, comprising:
 a substrate;
 a conductive film disposed on or above a back surface of the substrate;

a reflective layer disposed on or above a front surface of the substrate, the reflective layer reflecting EUV light; and
an absorption layer disposed on or above the reflective layer, the absorption layer absorbing the EUV light,
wherein the conductive film comprises at least one of nitrogen (N) and boron (B),
a total content of N and B contained in the conductive film is more than 0 at % and 65 at % or less,
the conductive film has a refractive index $n_{\lambda 1000\text{-}1100\ nm}$ of 5.300 or less and has an extinction coefficient $k_{\lambda 1000\text{-}1100\ nm}$ of 5.200 or less, at a wavelength of 1000 nm to 1100 nm,
the conductive film has a refractive index $n_{\lambda 600\text{-}700\ nm}$ of 4.300 or less and has an extinction coefficient $k_{\lambda 600\text{-}700\ nm}$ of 4.500 or less, at a wavelength of 600 nm to 700 nm,
the conductive film has a refractive index $n_{\lambda 400\text{-}500\ nm}$ of 2.500 or more and has an extinction coefficient $k_{\lambda 400\text{-}500\ nm}$ of 0.440 or more, at a wavelength of 400 nm to 500 nm,
the conductive film has a film thickness t of 20 nm to 350 nm, and
the conductive film has a resistivity of 3.5 mΩ·cm or less.

(2) A reflective mask blank for EUV lithography, comprising:
a substrate;
a conductive film disposed on or above a back surface of the substrate;
a reflective layer disposed on or above a front surface of the substrate, the reflective layer reflecting EUV light; and
an absorption layer disposed on or above the reflective layer, the absorption layer absorbing the EUV light,
wherein the conductive film comprises at least one of nitrogen (N) and boron (B),
a total content of N and B contained in the conductive film is more than 0 at % and 65 at % or less,
the conductive film has a refractive index $n_{\lambda 1000\text{-}1100\ nm}$ of 5.300 or less and has an extinction coefficient $k_{\lambda 1000\text{-}1100\ nm}$ of 5.200 or less, at a wavelength of 1000 nm to 1100 nm,
the conductive film has a refractive index $n_{\lambda 600\text{-}700\ nm}$ of 4.300 or less and has an extinction coefficient $k_{\lambda 600\text{-}700\ nm}$ of 4.500 or less, at a wavelength of 600 nm to 700 nm,
the conductive film has a refractive index $n_{\lambda 480\text{-}500\ nm}$ of 2.500 or more and has an extinction coefficient $k_{\lambda 480\text{-}500\ nm}$ of 0.440 or more, at a wavelength of 480 nm to 500 nm,
the conductive film has a film thickness t of 20 nm to 350 nm, and
the conductive film has a resistivity of 3.5 mΩ·cm or less.

(3) The reflective mask blank for EUV lithography according to (1) or (2), wherein the conductive film comprises at least one of tantalum (Ta) and chromium (Cr).

(4) The reflective mask blank for EUV lithography according to (1) or (2), wherein the conductive film comprises Ta and N.

(5) The reflective mask blank for EUV lithography according to (4), wherein the conductive film comprises N in an amount of more than 0 at % and 65 at % or less.

(6) The reflective mask blank for EUV lithography according to (1) or (2), wherein the conductive film comprises Ta and B.

(7) The reflective mask blank for EUV lithography according to (6), wherein the conductive film comprises B in an amount of more than 0 at % and 35 at % or less.

(8) The reflective mask blank for EUV lithography according to (1) or (2), wherein the resistivity of the conductive film is 0.050 mΩ·cm or more and 3.5 mΩ·cm or less.

(9) The reflective mask blank for EUV lithography according to (3) or (4), wherein the conductive film comprises Ta, and a full width at half maximum FWHM of a diffraction peak attributed to a bcc (110) plane of Ta among diffraction peaks derived from the conductive film and observed by an out-of-plane XRD method is 1.5° to 4.0°.

(10) The reflective mask blank for EUV lithography according to any one of (1) to (4), wherein the conductive film has a light transmittance at the wavelength of 1000 nm to 1100 nm of 1.0% or more, a light transmittance at the wavelength of 600 nm to 700 nm of 1.0% or more, and a light transmittance at the wavelength of 400 nm to 500 nm of 1.0% or less.

(11) The reflective mask blank for EUV lithography according to any one of (1) to (4), wherein the conductive film has a sheet resistance value of 250 Ω/sq. or less.

(12) The reflective mask blank for EUV lithography according to any one of (1) to (4), wherein the conductive film has a surface hardness of 10.0 GPa or more.

(13) The reflective mask blank for EUV lithography according to any one of (1) to (4), wherein the reflective mask blank further comprises an upper layer disposed on or above the conductive film, and the upper layer comprises chromium (Cr) and at least one element selected from the group consisting of nitrogen (N) and oxygen (O).

(14) The reflective mask blank for EUV lithography according to any one of (1) to (4), wherein the conductive film has a surface roughness (Rq) of 0.600 nm or less.

(15) A substrate with a conductive film, comprising:
a conductive film disposed on or above the substrate, wherein the conductive film comprises at least one of nitrogen (N) and boron (B),
a total content of N and B contained in the conductive film is more than 0 at % and 65 at % or less,
the conductive film has a refractive index $n_{\lambda 1000\text{-}1100\ nm}$ of 5.300 or less and has an extinction coefficient $k_{\lambda 1000\text{-}1100\ nm}$ of 5.200 or less, at a wavelength of 1000 nm to 1100 nm,
the conductive film has a refractive index $n_{\lambda 600\text{-}700\ nm}$ of 4.300 or less and has an extinction coefficient $k_{\lambda 600\text{-}700\ nm}$ of 4.500 or less, at a wavelength of 600 nm to 700 nm,
the conductive film has a refractive index $n_{\lambda 400\text{-}500\ nm}$ of 2.500 or more and has an extinction coefficient $k_{\lambda 400\text{-}500\ nm}$ of 0.440 or more, at a wavelength of 400 nm to 500 nm,
the conductive film has a film thickness t of 20 nm to 350 nm, and the conductive film has a resistivity of 3.5 mΩ·cm or less.

(16) A substrate with a conductive film, comprising:
a conductive film disposed on or above the substrate, wherein the conductive film comprises at least one of nitrogen (N) and boron (B),
a total content of N and B contained in the conductive film is more than 0 at % and 65 at % or less,
the conductive film has a refractive index $n_{\lambda 1000\text{-}1100\ nm}$ of 5.300 or less and has an extinction coefficient $k_{\lambda 1000\text{-}1100\ nm}$ of 5.200 or less, at a wavelength of 1000 nm to 1100 nm,
the conductive film has a refractive index $n_{\lambda 600\text{-}700\ nm}$ of 4.300 or less and has an extinction coefficient $k_{\lambda 600\text{-}700\ nm}$ of 4.500 or less, at a wavelength of 600 nm to 700 nm,
the conductive film has a refractive index $n_{\lambda 480\text{-}500\ nm}$ of 2.500 or more and has an extinction coefficient $k_{\lambda 480\text{-}500\ nm}$ of 0.440 or more, at a wavelength of 480 nm to 500 nm,
the conductive film has a film thickness t of 20 nm to 350 nm, and
the conductive film has a resistivity of 3.5 mΩ·cm or less.

(17) The substrate with the conductive film according to (15) or (16), wherein the conductive film comprises at least one of tantalum (Ta) and chromium (Cr).

(18) The substrate with the conductive film according to (15) or (16), wherein the conductive film comprises Ta and N.

(19) The substrate with the conductive film according to (18), wherein the conductive film comprises N in an amount of more than 0 at % and 65 at % or less.

(20) The substrate with the conductive film according to (15) or (16), wherein the conductive film comprises Ta and B.

(21) The substrate with the conductive film according to (20), wherein the conductive film comprises B in an amount of more than 0 at % and 35 at % or less.

(22) The substrate with the conductive film according to (15) or (16), wherein the resistivity of the conductive film is 0.050 mΩ·cm or more and 3.5 mΩ·cm or less.

(23) The substrate with the conductive film according to (17) or (18), wherein the conductive film comprises Ta, and a full width at half maximum FWHM of a diffraction peak attributed to a bcc (110) plane of Ta among diffraction peaks derived from the conductive film and observed by an out-of-plane XRD method is 1.5° to 4.0°.

(24) The substrate with the conductive film according to any one of (15) to (18), wherein the conductive film has a light transmittance at the wavelength of 1000 nm to 1100 nm of 1.0% or more, a light transmittance at the wavelength of 600 nm to 700 nm of 1.0% or more, and a light transmittance at the wavelength of 400 nm to 500 nm of 1.0% or less.

(25) The substrate with the conductive film according to any one of (15) to (18), wherein the conductive film has a sheet resistance value of 250 Ω/sq. or less.

(26) The substrate with the conductive film according to any one of (15) to (18), wherein the conductive film has a surface hardness of 10.0 GPa or more.

(27) The substrate with the conductive film according to any one of (15) to (18), wherein the substrate with the conductive film further comprises an upper layer disposed on or above the conductive film, and
the upper layer comprises chromium (Cr) and at least one element selected from the group consisting of nitrogen (N) and oxygen (O).

(28) The substrate with the conductive film according to any one of (15) to (18), wherein the conductive film has a surface roughness (Rq) of 0.600 nm or less.

EXAMPLES

Hereinafter, the present invention will be described in more detail using Examples 1 to 10, but the present invention is not limited to these Examples. Examples 1 to 3, 5, and 10 are inventive examples, and Examples 4, and 6 to 9 are comparative examples.

Example 1

In this Example, a TaN film was formed as a conductive film on one surface of a substrate.

As the substrate for forming a film, an $SiO_2$—$TiO_2$ glass substrate (outer shape: 6-inch (152 mm) square, thickness: 6.3 mm) was used. The glass substrate has a coefficient of thermal expansion at 20° C. of $0.02\times10^{-7}$/° C., a Young's modulus of 67 GPa, a Poisson's ratio of 0.17, and a specific rigidity of $3.07\times10^7$ m²/s². This glass substrate was polished to form a smooth surface having a surface roughness (Rq) of 0.15 nm or less and a flatness of 100 nm or less.

The TaN film was formed as a conductive film on one surface of the substrate by a magnetron sputtering method. The film-forming conditions of the TaN film are as follows.
(Film-Forming Conditions)
Target: Ta target
Sputtering gas: a mixed gas of Ar and $N_2$ (Ar: 90 vol %, $N_2$: 10 vol %, gas pressure: 0.12 Pa)
Supplied electric power: 1000 W
Film-forming rate: 6 nm/min
Film thickness: 56 nm
(Composition Analysis of TaN Film)
The composition of the TaN film was measured using a Rutherford backscattering spectrometer (Rutherford backscattering spectrometry: RBS). The N content of the TaN film was 21.0 at %.
(Refractive Index n and Extinction Coefficient k)
For the formed TaN film, the refractive index $n_{\lambda 1000\text{-}1100\ nm}$ at a wavelength of 1000 nm to 1100 nm and the extinction coefficient $k_{\lambda 1000\text{-}1100\ nm}$ at the wavelength of 1000 nm to 1100 nm were determined using a spectroscopic ellipsometer (manufacturer: J. A. Woollam, model: M2000-DI). Light beams were incident from the surface on which the TaN film was formed, and a polarization state was measured and analyzed at room temperature to calculate the refractive index $n_{\lambda 1000\text{-}1100\ nm}$ at the wavelength of 1000 nm to 1100 nm and the extinction coefficient $k_{\lambda 1000\text{-}1100\ nm}$ at the wavelength of 1000 nm to 1100 nm. The refractive index $n_{\lambda 600\text{-}700\ nm}$ at a wavelength of 600 nm to 700 nm and the extinction coefficient $k_{\lambda 600\text{-}700\ nm}$ at the wavelength of 600 nm to 700 nm, the refractive index $n_{\lambda 400\text{-}500\ nm}$ at a wavelength of 400 nm to 500 nm and the extinction coefficient $k_{\lambda 400\text{-}500\ nm}$ at the wavelength of 400 nm to 500 nm, and the refractive index $n_{\lambda 480\text{-}500\ nm}$ at a wavelength of 480 nm to 500 nm and the extinction coefficient $k_{\lambda 480\text{-}500\ nm}$ at the wavelength of 480 nm to 500 nm were calculated in the same procedure. The results are shown in Table 2.
(Light Transmittance)
For the substrate after the TaN film was formed, light beams were perpendicularly incident from the surface on which the TaN film was formed, the light transmittance in a wavelength range of 175 nm to 2000 nm was measured using a spectrophotometer (manufacturer: Hitachi High-Technologies Corporation, model: U-4100), and the light transmittance at a wavelength of 1000 nm to 1100 nm, the light transmittance at a wavelength of 600 nm to 700 nm, and the light transmittance at a wavelength of 400 nm to 500 nm were determined. A case where the light transmittance at the wavelength of 1000 nm to 1100 nm was 1.0% or more, the light transmittance at the wavelength of 600 nm to 700 nm was 1.0% or more, and the light transmittance at the wavelength of 400 nm to 500 nm was 1.0% or less was evaluated as "A", and a case where any one of them is not satisfied was evaluated as "B". The results are shown in Table 1.

(XRD Full Width at Half Maximum FWHM)

The TaN film was measured by an out-of-plane XRD method. Among diffraction peaks derived from the TaN film, the full width at half maximum (FWHM) of the main peak of the diffraction peak attributed to the bcc (110) plane of Ta was measured in a diffraction angle range of 30° to 40°. The results are shown in Table 1.

(Surface Hardness)

The surface hardness of the TaN film was measured by a nano-indentation test. A case where the surface hardness was 10.0 GPa or more was evaluated as "A", and a case where the surface hardness was less than 10.0 GPa was evaluated as "B". The results are shown in Table 1.

(Resistivity)

The resistivity of the TaN film was calculated under the following conditions. A case where the resistivity was 3.5 mΩ·cm or less was evaluated as "A", and a case where the resistivity was more than 3.5 mΩ·cm was evaluated as "B". When the resistivity is as low as 3.5 mΩ·cm or less, it can be considered that a sufficient fixing force can be obtained when the EUV mask manufactured from the EUV mask blank is fixed to the exposure device.

The resistivity was evaluated from the surface of the sample conductive film.

Evaluation device: Loresta GX manufactured by Nittoseiko Analytech Co., Ltd.
Number of measurement points: 9
Measurement range: 149 mm×149 mm (Surface Roughness)

The surface roughness (mean square surface roughness RQ) was measured in a range of 2 μm×2 μm with an atomic force microscope (AFM) manufactured by Seiko Instruments Inc.

(Thermal Relaxation Rate of Flatness)

The flatness of the substrate with the TaN film after the formation of the TaN film was measured using a flatness measuring machine manufactured by Fujinon Corporation. Next, the flatness of the substrate with the TaN film after a heat treatment of the substrate with the TaN film at 136° C. for 20 minutes was measured using a flatness measuring machine manufactured by Fujinon Corporation. Next, the thermal relaxation rate of flatness was calculated by the following formula, and a case where the thermal relaxation rate of flatness was 15% or less was evaluated as "A", and a case where the thermal relaxation rate of flatness was more than 15% was evaluated as "B".

Thermal relaxation rate (%) of flatness={(flatness of substrate with TaN film before heat treatment−flatness of substrate with TaN film after heat treatment)/flatness of substrate with TaN film before heat treatment}×100

Example 2

In this Example, a laminated film including a TaN film and a CrN film was formed as a conductive film on one surface of the substrate by the magnetron sputtering method.

The film-forming conditions of the TaN film and the CrN film are as follows.

(TaN Film)
Target: Ta target
Sputtering gas: a mixed gas of Ar and $N_2$ (Ar: 60 vol %, $N_2$: 40 vol %, gas pressure: 0.11 Pa)
Supplied electric power: 1000 W
Film-forming rate: 3.9 nm/min
Film thickness: 23 nm (CrN Film)
Target: Cr target
Sputtering gas: a mixed gas of Ar and $N_2$ (Ar: 53 vol %, $N_2$: 47 vol %, gas pressure: 0.10 Pa)
Supplied electric power: 1700 W
Film-forming rate: 11.4 nm/min
Film thickness: 26 nm (Composition Analysis of TaN Film and CrN Film)

The compositions of the TaN film and the CrN film were measured using RBS. The N content of the TaN film was 59.0 at %, and the N content of the CrN film was 4.2 at %.

(Refractive Index n and Extinction Coefficient k)

The refractive index n and the extinction coefficient k of the laminated film were measured in the same procedure as in Example 1. The results are shown in Table 2. The values of the refractive index n and the extinction coefficient k described in Table 2 indicate the values of the TaN film. The values of the refractive index n and the extinction coefficient k of the CrN film were the same values as Examples 3, 4, and 9.

(Light Transmittance)

The light transmittance of the laminated film was measured by the same procedure as in Example 1. The results are shown in Table 1.

(XRD Full Width at Half Maximum FWHM)

The TaN film was measured by the out-of-plane XRD method, and among diffraction peaks derived from the TaN film, the full width at half maximum (FWHM) of the main peak of the diffraction peak attributed to the bcc (110) plane of Ta was measured in a diffraction angle range of 30° to 40°. The results are shown in Table 1.

(Surface Hardness)

The surface hardness of the laminated film was measured in the same procedure as in Example 1. The results are shown in Table 1.

(Resistivity)

The resistivity of the laminated film was measured in the same measurement method as in the case of Example 1. At this time, the resistivity of each of the TaN film and the CrN film is measured. The results are shown in Table 1.

(Surface Roughness)

The surface roughness of the laminated film was measured in the same procedure as in Example 1. The results are shown in Table 1.

(Thermal Relaxation Rate of Flatness)

The thermal relaxation rate of the flatness of the substrate with the laminated film was measured in the same procedure as in Example 1. The results are shown in Table 1.

Example 3

In this Example, a CrN film was formed as a conductive film on one surface of the substrate by the magnetron sputtering method.

The film-forming conditions of the CrN film are as follows.

(Film-Forming Conditions)
  Target: Cr target
  Sputtering gas: a mixed gas of Ar and $N_2$ (Ar: 53 vol %, $N_2$: 47 vol %, gas pressure: 0.10 Pa)
  Supplied electric power: 1700 W
  Film-forming rate: 11.4 nm/min
  Film thickness: 40 nm
(Composition Analysis of CrN Film)
  The composition of the CrN film was measured using RBS. The N content of the CrN film was 4.2 at %.
(Refractive Index n and Extinction Coefficient k)
  The refractive index n and the extinction coefficient k of the CrN film were measured in the same procedure as in Example 1. The results are shown in Table 2.
(Light Transmittance)
  The light transmittance of the CrN film was measured in the same procedure as in Example 1. The results are shown in Table 1.
(Surface Hardness)
  The surface hardness of the CrN film was measured in the same procedure as in Example 1. The results are shown in Table 1.
(Resistivity)
  The resistivity of the CrN film was measured in the same measurement method as in Example 1. The results are shown in Table 1.
(Thermal Relaxation Rate of Flatness)
  The thermal relaxation rate of the flatness of the substrate with the CrN film was measured in the same procedure as in Example 1. The results are shown in Table 1.

Example 4

In this Example, a CrN film was formed in the same procedure as in Example 3 except that the film thickness of the CrN film was 360 nm.
(Composition Analysis of CrN Film)
  The composition of the CrN film was measured using RBS. The N content of the CrN film was 4.2 at %.
(Refractive Index n and Extinction Coefficient k)
  The refractive index n and the extinction coefficient k of the CrN film were measured in the same procedure as in Example 1. The results are shown in Table 2.
(Light Transmittance)
  The light transmittance of the CrN film was measured in the same procedure as in Example 1. The results are shown in Table 1.
(Surface Hardness)
  The surface hardness of the CrN film was measured in the same procedure as in Example 1. The results are shown in Table 1.
(Resistivity)
  The resistivity of the CrN film was measured in the same measurement method as in Example 1. The results are shown in Table 1.
(Thermal Relaxation Rate of Flatness)
  The thermal relaxation rate of the flatness of the substrate with the CrN film was measured in the same procedure as in Example 1. The results are shown in Table 1.

Example 5

In this Example, a TaB film was formed as a conductive film on one surface of the substrate by the magnetron sputtering method.
  The film-forming conditions of the TaB film are as follows.
(Film-Forming Conditions)
  Target: TaB Compound Target
  Sputtering gas: Ar gas (gas pressure: 0.205 Pa)
  Supplied electric power: 1000 W
  Film-forming rate: 1.67 nm/min
  Film thickness: 56 nm
(Composition Analysis of TaB Film)
  The composition of the TaB film was measured using RBS and X-ray photoelectron spectroscopy (XPS). The N content of the TaB film was 0.0 at %, and the B content of the TaB film was 28.0 at %.
(Refractive Index n and Extinction Coefficient k)
  The refractive index n and the extinction coefficient k of the TaB film were measured in the same procedure as in Example 1. The results are shown in Table 2.
(Light Transmittance)
  The light transmittance of the laminated film was measured by the same procedure as in Example 1. The results are shown in Table 1.
(XRD Full Width at Half Maximum FWHM)
  The TaB film was measured by the out-of-plane XRD method, and among diffraction peaks derived from the TaB film, the full width at half maximum (FWHM) of the main peak of the diffraction peak attributed to the bcc (110) plane of Ta was measured in a diffraction angle range of 30° to 40°. The results are shown in Table 1.
(Surface Hardness)
  The surface hardness of the TaB film was measured by the same procedure as in Example 1. The results are shown in Table 1.
(Resistivity)
  The resistivity of the TaB film was measured in the same measurement method as in Example 1. The results are shown in Table 1.
(Surface Roughness)
  The surface roughness of the TaB film was measured in the same procedure as in Example 1. The results are shown in Table 1.
(Thermal Relaxation Rate of Flatness)
  The thermal relaxation rate of the flatness of the substrate with the TaB film was measured in the same procedure as in Example 1. The results are shown in Table 1.

Example 6

In this Example, a TaON film was formed as a conductive film on one surface of the substrate by the magnetron sputtering method.
  The film-forming conditions of the TaON film are as follows.
(Film-Forming Conditions)
  Target: Ta target
  Sputtering gas: a mixed gas of $N_2$ and $O_2$ ($N_2$: 88 vol %, $O_2$: 12 vol %, gas pressure: 0.18 Pa)
  Supplied electric power: 1000 W
  Film-forming rate: 0.9 nm/min
  Film thickness: 60 nm
(Composition Analysis of TaON Film)
  The composition of the TaON film was measured using RBS. The N content of the TaON film was 6.0 at %, and the O content of the TaON film was 68.0 at %.
(Refractive Index n and Extinction Coefficient k)
  The refractive index n and the extinction coefficient k of the TaON film were measured in the same procedure as in Example 1. The results are shown in Table 2.

(Light Transmittance)

The light transmittance of the TaON film was measured in the same procedure as in Example 1. The results are shown in Table 1.

(Resistance Value)

The resistivity of the TaON film was measured in the same measurement method as in Example 1. The results are shown in Table 1.

Example 7

In this Example, a CrON film was formed as a conductive film on one surface of the substrate by the magnetron sputtering method.

The film-forming conditions of the CrON film are as follows.

(Film-Forming Conditions)

Target: Cr target

Sputtering gas: a mixed gas of Ar, $N_2$ and $O_2$ (Ar: 33 vol %, $N_2$: 22 vol %, $O_2$: 45 vol %, gas pressure: 0.09 Pa)

Supplied electric power: 750 W

Film-forming rate: 1.86 nm/min

Film thickness: 60 nm

The refractive index n and the extinction coefficient k of the CrON film were measured in the same procedure as in Example 1. The results are shown in Table 2.

(Light Transmittance)

The light transmittance of the CrON film was measured in the same procedure as in Example 1. The results are shown in Table 1.

Example 8

In this Example, a TaN film was formed in the same procedure as in Example 1 except that the film thickness of the TaN film was 17 nm.

(Composition Analysis of TaN Film)

The composition of the TaN film was measured using RBS. The N content of the TaN film was 21.0 at %.

(Refractive Index n and Extinction Coefficient k)

The refractive index n and the extinction coefficient k of the TaN film were measured in the same procedure as in Example 1. The results are shown in Table 2.

(Light Transmittance)

The light transmittance of the TaN film was measured in the same procedure as in Example 1. The results are shown in Table 1.

(Thermal Relaxation Rate of Flatness)

The thermal relaxation rate of the flatness of the substrate with the TaN film was measured in the same procedure as in Example 1. The results are shown in Table 1.

Example 9

In this Example, a CrN film was formed in the same procedure as in Example 3 except that the film thickness of the CrN film was 12 nm.

(Composition Analysis of CrN Film)

The composition of the CrN film was measured using RBS. The N content of the CrN film was 4.2 at %.

(Refractive Index n and Extinction Coefficient k)

The refractive index n and the extinction coefficient k of the CrN film were measured in the same procedure as in Example 1. The results are shown in Table 2.

(Light Transmittance)

The light transmittance of the CrN film was measured in the same procedure as in Example 1. The results are shown in Table 1.

(Thermal Relaxation Rate of Flatness)

The thermal relaxation rate of the flatness of the substrate with the CrN film was measured in the same procedure as in Example 1. The results are shown in Table 1.

Example 10

In this Example, a TaN film was formed as a conductive film on one surface of a substrate, and a CrO film was further formed as an upper layer by the magnetron sputtering method. The TaN film was formed under the same film-forming conditions as the TaN film in Example 2 except that the film thickness of the TaN film was changed.

The film-forming conditions of the TaN film and the CrO film are as follows.

(TaN Film)

Target: Ta target

Sputtering gas: a mixed gas of Ar and $N_2$ (Ar: 60 vol %, $N_2$: 40 vol %, gas pressure: 0.11 Pa)

Supplied electric power: 1000 W

Film-forming rate: 3.9 nm/min

Film thickness: 30 nm (CrO Film)

Target: Cr target

Sputtering gas: a mixed gas of Ar and $O_2$ (Ar: 66 vol %, $O_2$: 34 vol %, gas pressure: 0.16 Pa)

Supplied electric power: 750 W

Film-forming rate: 9.0 nm/min

Film thickness: 27 nm (Composition Analysis of TaN Film and CrO Film)

The compositions of the TaN film and the CrO film were measured using RBS. The N content of the TaN film was 59.0 at %, and the O content of the CrO film was 15.0 at %.

(Refractive Index n and Extinction Coefficient k)

The refractive index n and the extinction coefficient k of the laminated film were measured in the same procedure as in Example 1. The results are shown in Table 2. The values of the refractive index n and the extinction coefficient k described in Table 2 indicate the values of the CrO film. The values of the refractive index n and the extinction coefficient k of the TaN film were the same values as the TaN film in Example 2.

(Light Transmittance)

The light transmittance of the laminated film was measured by the same procedure as in Example 1. The results are shown in Table 1.

(Surface Hardness)

The surface hardness of the laminated film was measured in the same procedure as in Example 1. The results are shown in Table 1.

(Resistivity)

The resistivity of the TaN film was measured in the same measurement method as in Example 1. The results are shown in Table 1.

(Surface Roughness)

The surface roughness of the laminate was measured in the same procedure as in Example 1. The results are shown in Table 1.

(Thermal Relaxation Rate of Flatness)

The thermal relaxation rate of the flatness of the substrate with the laminated film was measured in the same procedure as in Example 1. The results are shown in Table 1.

TABLE 1

|  |  | Example 1 | Example 2 | | Example 3 | Example 4 | Example 5 | Example 6 |
|---|---|---|---|---|---|---|---|---|
| Film type | | TaN | TaN/CrN | | CrN | CrN | TaB | TaON |
| | | | TaN | CrN | | | | |
| Film-forming conditions | Film-forming method | | | | Magnetron sputtering | | | |
| | Gas type | Ar + $N_2$ | Ar + $N_2$ | Ar + $N_2$ | Ar + $N_2$ | Ar + $N_2$ | Noble gas | $N_2$ + $O_2$ |
| | $N_2$ (vol %) | 10 | 40 | 47 | 47 | 47 | 0 | 88 |
| | $O_2$ (vol %) | — | — | — | — | — | — | 12 |
| | Film thickness (nm) | 56 | 23 | 26 | 40 | 360 | 56 | 60 |
| Evaluation | N (at %_RBS) | 21.0 | 59.0 | 4.2 | 4.2 | 4.2 | 0.0 | 6.0 |
| | O (at %_RBS) | — | — | — | — | — | — | 68.0 |
| | B (at %_XPS) | — | — | — | — | — | 28.0 | — |
| | n, k | | | | See Table 2 | | | |
| | Light transmittance (%) 400-500 nm | 0.8 | 0.8 | | 0.5 | 0.0 | 0.9 | 72.0 |
| | 600-700 nm | 1.5 | 1.6 | | 1.0 | 0.0 | 1.7 | 75.0 |
| | 1000-1100 nm | 2.8 | 3.2 | | 2.3 | 0.0 | 3.0 | 84.0 |
| | Determination | A | A | | A | B | A | B |
| | XRD FWHM, (Ta bcc 110 plane) (°) | 3.5 | 2.1 | | — | — | 4.9 | — |
| | Surface hardness (Gpa) | 10.2 | 14.9 | | 16.3 | 17 | 8.8 | — |
| | Determination | A | A | | A | A | B | — |
| | Flatness (warpage) Determination | A | A | | B | A | A | — |
| | Resistivity of conductive film (mΩ · cm) | 0.230 | 0.157 | | 0.108 | 0.094 | 0.228 | >2.4B$10^5$ |
| | Determination | A | A | | A | A | A | B |
| | Surface roughness | 0.083 | 0.132 | | — | — | 0.066 | — |
| | Thermal relaxation rate of flatness (warpage) (%) | 7 | 13 | | 50 | 50 | 7 | — |
| | Determination | A | A | | B | B | A | — |

|  |  | Example 7 | Example 8 | Example 9 | Example 10 | |
|---|---|---|---|---|---|---|
| Film type | | CrON | TaN | CrN | TaN/CrO | |
| | | | | | TaN (conductive film) | CrO (upper layer) |
| Film-forming conditions | Film-forming method | | | Magnetron sputtering | | |
| | Gas type | Ar + $N_2$ + $O_2$ | Ar + $N_2$ | Ar + $N_2$ | Ar + $N_2$ | Ar + $O_2$ |
| | $N_2$ (vol %) | 22 | 10 | 47 | 40 | — |
| | $O_2$ (vol %) | 45 | — | — | — | 34 |
| | Film thickness (nm) | 60 | 17 | 12 | 30 | 27 |
| Evaluation | N (at %_RBS) | — | 21.0 | 4.2 | 59.0 | — |
| | O (at %_RBS) | — | — | — | — | 15.0 |
| | B (at %_XPS) | — | — | — | — | — |
| | n, k | | | See Table 2 | | |
| | Light transmittance (%) 400-500 nm | 40.0 | 13.0 | 12.0 | 0.8 | |
| | 600-700 nm | 49.0 | 14.0 | 12.0 | 1.5 | |
| | 1000-1100 nm | 64.0 | 16.0 | 15.0 | 3.4 | |
| | Determination | B | B | B | A | |
| | XRD FWHM, (Ta bcc 110 plane) (°) | — | — | — | 2.1 | — |
| | Surface hardness (Gpa) | — | — | — | 8.9 | |
| | Determination | — | — | — | B | |
| | Flatness (warpage) Determination | — | — | — | A | |
| | Resistivity of conductive film (mΩ · cm) | — | — | — | 0.185 | |
| | Determination | — | — | — | A | |
| | Surface roughness | — | — | — | 0.35 | |
| | Thermal relaxation rate of flatness (warpage) (%) | — | 7 | 50 | 2 | |
| | Determination | — | A | B | A | |

TABLE 2

| Wavelength | | Examples 1 and 8 TaN | | Example 2 TaN/CrN | | Examples 3, 4, and 9 CrN | | Example 5 TaB | |
|---|---|---|---|---|---|---|---|---|---|
| | | n | k | n | k | n | k | n | k |
| 1000-1100 nm | min | 4.419 | 3.709 | 4.321 | 3.049 | 5.007 | 4.966 | 4.238 | 3.749 |
| | max | 4.593 | 3.836 | 4.501 | 3.104 | 5.214 | 5.164 | 4.410 | 3.900 |
| 600-700 nm | min | 3.490 | 3.148 | 3.266 | 2.629 | 3.894 | 4.407 | 3.379 | 3.106 |
| | max | 3.769 | 3.304 | 3.590 | 2.797 | 4.288 | 4.485 | 3.630 | 3.275 |
| 400-500 nm | min | 2.775 | 2.764 | 2.698 | 1.989 | 2.517 | 3.849 | 2.737 | 2.758 |
| | max | 3.167 | 2.971 | 2.931 | 2.358 | 3.278 | 4.264 | 3.092 | 2.931 |

TABLE 2-continued

| | | | | | | | | | |
|---|---|---|---|---|---|---|---|---|---|
| 480-500 nm | min | 3.095 | 2.933 | 2.871 | 2.289 | 3.130 | 4.208 | 3.028 | 2.896 |
| | max | 3.167 | 2.971 | 2.931 | 2.358 | 3.278 | 4.264 | 3.092 | 2.931 |

| | | Example 6 TaON | | Example 7 CrON | | Example 10 TaN/CrO | |
|---|---|---|---|---|---|---|---|
| Wavelength | | n | k | n | k | n | k |
| 1000-1100 nm | min | 2.052 | 0.000 | 2.243 | 0.121 | 4.877 | 3.416 |
| | max | 2.056 | 0.000 | 2.429 | 0.142 | 5.004 | 3.478 |
| 600-700 nm | min | 2.080 | 0.000 | 2.425 | 0.232 | 3.937 | 3.358 |
| | max | 2.098 | 0.000 | 2.420 | 0.270 | 4.292 | 3.371 |
| 400-500 nm | min | 2.132 | 0.000 | 2.428 | 0.319 | 2.748 | 3.106 |
| | max | 2.203 | 0.000 | 2.460 | 0.430 | 3.425 | 3.333 |
| 480-500 nm | min | 2.132 | 0.000 | 2.428 | 0.319 | 3.301 | 3.308 |
| | max | 2.141 | 0.000 | 2.433 | 0.334 | 3.425 | 3.333 |

In each of Examples 1, 2, 3, 5, and 10 in which the refractive index $n_{\lambda 1000\text{-}1100\ nm}$ Was 5.300 or less, the extinction coefficient $k_{\lambda 1000\text{-}1100\ nm}$ was 5.200 or less, the refractive index $n_{\lambda 600\text{-}700\ nm}$ was 4.300 or less, the extinction coefficient $k_{\lambda 600\text{-}700\ nm}$ was 4.500 or less, the refractive index $n_{\lambda 400\text{-}500\ nm}$ was 2.600 or more, the extinction coefficient $k_{\lambda 400\text{-}500\ nm}$ was 0.440 or more, the refractive index $n_{\lambda 480\text{-}500\ nm}$ was 2.500 or more, the extinction coefficient $k_{\lambda 480\text{-}500\ nm}$ was 0.440 or more, and the film thickness t of the conductive film was 20 nm to 350 nm, the light transmittance was evaluated as "A", and the resistivity of the conductive film was evaluated as "A".

In each of Example 1 in which the conductive film 12 was a TaN film, Example 2 in which the conductive film 12 was a laminated film including a CrN film and a TaN film, Example 5 in which the conductive film 12 was a TaB film, and Example 10 in which a CrO film was provided as an upper layer on a TaN film, the thermal relaxation rate of the flatness of the substrate with the conductive film was evaluated as "A".

In each of Example 1 in which the conductive film 12 was a TaN film, Example 2 in which the conductive film 12 was a laminated film including a CrN film and a TaN film, and Example 3 in which the conductive film 12 was a CrN film, the surface hardness of the conductive film 12 was 10.0 GPa or more, and the surface hardness was evaluated as "A".

In each of Examples 6 and 7 in which the refractive index $n_{\lambda 400\text{-}500\ nm}$ was less than 2.500, the extinction coefficient $k_{\lambda 400\text{-}500\ nm}$ was less than 0.440, the refractive index $n_{\lambda 480\text{-}500\ nm}$ was less than 2.500, the extinction coefficient $k_{\lambda 480\text{-}500\ nm}$ was less than 0.440, and the light transmittance at a wavelength of 400 nm to 500 nm was as high as more than 1.0%, the light transmittance was evaluated as "B". In Comparative Example 6, the resistivity of the conductive film was evaluated as "B".

In Example 4 in which the film thickness t of the conductive film was more than 350 nm, both the light transmittance at a wavelength of 1000 nm to 1100 nm and the light transmittance at a wavelength of 600 nm to 700 nm were 0.0%, and the light transmittance was evaluated as "B".

In each of Examples 8 and 9 in which the film thickness t of the conductive film was less than 20 nm, the light transmittance at a wavelength of 400 nm to 500 nm was as high as more than 1.0%, and the light transmittance was evaluated as "B"

Although various embodiments have been described above with reference to the drawings, it is needless to say that the present invention is not limited to such examples. It is obvious for a person skilled in the art that various modifications and variations can be made within the category described in the scope of claims and it is understood that such modifications and variations naturally belong to the technical scope of the present invention. Further, the components described in the above embodiment may be combined in any manner without departing from the spirit of the invention.

Note that the present application is based on Japanese Patent Application No. 2023-043149 filed on Mar. 17, 2023, contents of which are incorporated herein by reference.

REFERENCE SIGNS LIST

10: EUV mask blank
11: substrate
12: conductive film
13: reflective layer (multilayer reflective film)
14: absorption layer

What is claimed is:

1. A reflective mask blank for EUV lithography, comprising:
   a substrate;
   a conductive film disposed on or above a back surface of the substrate;
   a reflective layer disposed on or above a front surface of the substrate, the reflective layer reflecting EUV light; and
   an absorption layer disposed on or above the reflective layer, the absorption layer absorbing the EUV light,
   wherein the conductive film comprises at least one of nitrogen (N) and boron (B),
   a total content of N and B contained in the conductive film is more than 0 at % and 65 at % or less,
   the conductive film has a refractive index $n_{\lambda 1000\text{-}1100\ nm}$ of 5.300 or less and has an extinction coefficient $k_{\lambda 1000\text{-}1100\ nm}$ of 5.200 or less, at a wavelength of 1000 nm to 1100 nm,
   the conductive film has a refractive index $n_{\lambda 600\text{-}700\ nm}$ of 4.300 or less and has an extinction coefficient $k_{\lambda 600\text{-}700\ nm}$ of 4.500 or less, at a wavelength of 600 nm to 700 nm,
   the conductive film has a refractive index $n_{\lambda 400\text{-}500\ nm}$ of 2.500 or more and has an extinction coefficient $k_{\lambda 400\text{-}500\ nm}$ of 0.440 or more, at a wavelength of 400 nm to 500 nm,
   the conductive film has a film thickness t of 20 nm to 350 nm, and
   the conductive film has a resistivity of 3.5 mΩ·cm or less.

2. A reflective mask blank for EUV lithography, comprising:
  a substrate;
  a conductive film disposed on or above a back surface of the substrate;
  a reflective layer disposed on or above a front surface of the substrate, the reflective layer reflecting EUV light; and
  an absorption layer disposed on or above the reflective layer, the absorption layer absorbing the EUV light,
  wherein the conductive film comprises at least one of nitrogen (N) and boron (B),
  a total content of N and B contained in the conductive film is more than 0 at % and 65 at % or less,
  the conductive film has a refractive index $n_{\lambda 1000\text{-}1100\ nm}$ of 5.300 or less and has an extinction coefficient $k_{\lambda 1000\text{-}1100\ nm}$ of 5.200 or less, at a wavelength of 1000 nm to 1100 nm,
  the conductive film has a refractive index $n_{\lambda 600\text{-}700\ nm}$ of 4.300 or less and has an extinction coefficient $k_{\lambda 600\text{-}700\ nm}$ of 4.500 or less, at a wavelength of 600 nm to 700 nm,
  the conductive film has a refractive index $n_{\lambda 480\text{-}500\ nm}$ of 2.500 or more and has an extinction coefficient $k_{\lambda 480\text{-}500\ nm}$ of 0.440 or more, at a wavelength of 480 nm to 500 nm,
  the conductive film has a film thickness t of 20 nm to 350 nm, and
  the conductive film has a resistivity of 3.5 mΩ·cm or less.

3. The reflective mask blank for EUV lithography according to claim 1, wherein the conductive film comprises at least one of tantalum (Ta) and chromium (Cr).

4. The reflective mask blank for EUV lithography according to claim 1, wherein the conductive film comprises Ta and N.

5. The reflective mask blank for EUV lithography according to claim 4, wherein the conductive film comprises N in an amount of more than 0 at % and 65 at % or less.

6. The reflective mask blank for EUV lithography according to claim 1, wherein the conductive film comprises Ta and B.

7. The reflective mask blank for EUV lithography according to claim 6, wherein the conductive film comprises B in an amount of more than 0 at % and 35 at % or less.

8. The reflective mask blank for EUV lithography according to claim 1, wherein the resistivity of the conductive film is 0.050 mΩ·cm or more and 3.5 mΩ·cm or less.

9. The reflective mask blank for EUV lithography according to claim 1, wherein the conductive film comprises Ta, and
  a full width at half maximum FWHM of a diffraction peak attributed to a bcc (110) plane of Ta among diffraction peaks derived from the conductive film and observed by an out-of-plane XRD method is 1.5° to 4.0°.

10. The reflective mask blank for EUV lithography according to claim 1, wherein the conductive film has a light transmittance at the wavelength of 1000 nm to 1100 nm of 1.0% or more, a light transmittance at the wavelength of 600 nm to 700 nm of 1.0% or more, and a light transmittance at the wavelength of 400 nm to 500 nm of 1.0% or less.

11. The reflective mask blank for EUV lithography according to claim 1, wherein the conductive film has a sheet resistance value of 250 Ω/sq. or less.

12. The reflective mask blank for EUV lithography according to claim 1, wherein the conductive film has a surface hardness of 10.0 GPa or more.

13. The reflective mask blank for EUV lithography according to claim 1, wherein the reflective mask blank further comprises an upper layer disposed on or above the conductive film, and
  the upper layer comprises chromium (Cr) and at least one element selected from the group consisting of nitrogen (N) and oxygen (O).

14. The reflective mask blank for EUV lithography according to claim 1, wherein the conductive film has a surface roughness (Rq) of 0.600 nm or less.

15. A substrate with a conductive film, comprising:
  a conductive film disposed on or above the substrate,
  wherein the conductive film comprises at least one of nitrogen (N) and boron (B),
  a total content of N and B contained in the conductive film is more than 0 at % and 65 at % or less,
  the conductive film has a refractive index $n_{\lambda 1000\text{-}1100\ nm}$ of 5.300 or less and has an extinction coefficient $k_{\lambda 1000\text{-}1100\ nm}$ of 5.200 or less, at a wavelength of 1000 nm to 1100 nm,
  the conductive film has a refractive index $n_{\lambda 600\text{-}700\ nm}$ of 4.300 or less and has an extinction coefficient $k_{\lambda 600\text{-}700\ nm}$ of 4.500 or less, at a wavelength of 600 nm to 700 nm,
  the conductive film has a refractive index $n_{\lambda 400\text{-}500\ nm}$ of 2.500 or more and has an extinction coefficient $k_{\lambda 400\text{-}500\ nm}$ of 0.440 or more, at a wavelength of 400 nm to 500 nm,
  the conductive film has a film thickness t of 20 nm to 350 nm, and
  the conductive film has a resistivity of 3.5 mΩ·cm or less.

16. A substrate with a conductive film, comprising:
  a conductive film disposed on or above the substrate,
  wherein the conductive film comprises at least one of nitrogen (N) and boron (B),
  a total content of N and B contained in the conductive film is more than 0 at % and 65 at % or less,
  the conductive film has a refractive index $n_{\lambda 1000\text{-}1100\ nm}$ of 5.300 or less and has an extinction coefficient $k_{\lambda 1000\text{-}1100\ nm}$ of 5.200 or less, at a wavelength of 1000 nm to 1100 nm,
  the conductive film has a refractive index $n_{\lambda 600\text{-}700\ nm}$ of 4.300 or less and has an extinction coefficient $k_{\lambda 600\text{-}700\ nm}$ of 4.500 or less, at a wavelength of 600 nm to 700 nm,
  the conductive film has a refractive index $n_{\lambda 480\text{-}500\ nm}$ of 2.500 or more and has an extinction coefficient $k_{\lambda 480\text{-}500\ nm}$ of 0.440 or more, at a wavelength of 480 nm to 500 nm,
  the conductive film has a film thickness t of 20 nm to 350 nm, and
  the conductive film has a resistivity of 3.5 mΩ·cm or less.

17. The substrate with the conductive film according to claim 15, wherein the conductive film comprises at least one of tantalum (Ta) and chromium (Cr).

18. The substrate with the conductive film according to claim 15, wherein the conductive film comprises Ta and N.

19. The substrate with the conductive film according to claim 18, wherein the conductive film comprises N in an amount of more than 0 at % and 65 at % or less.

20. The substrate with the conductive film according to claim 15, wherein the conductive film comprises Ta and B.

21. The substrate with the conductive film according to claim 20, wherein the conductive film comprises B in an amount of more than 0 at % and 35 at % or less.

22. The substrate with the conductive film according to claim 15, wherein the resistivity of the conductive film is 0.050 mΩ·cm or more and 3.5 mΩ·cm or less.

23. The substrate with the conductive film according to claim 15, wherein the conductive film comprises Ta, and
   a full width at half maximum FWHM of a diffraction peak attributed to a bcc (110) plane of Ta among diffraction peaks derived from the conductive film and observed by an out-of-plane XRD method is 1.5° to 4.0°.

24. The substrate with the conductive film according to claim 15, wherein the conductive film has a light transmittance at the wavelength of 1000 nm to 1100 nm of 1.0% or more, a light transmittance at the wavelength of 600 nm to 700 nm of 1.0% or more, and a light transmittance at the wavelength of 400 nm to 500 nm of 1.0% or less.

25. The substrate with the conductive film according to claim 15, wherein the conductive film has a sheet resistance value of 250 Ω/sq. or less.

26. The substrate with the conductive film according to claim 15, wherein the conductive film has a surface hardness of 10.0 GPa or more.

27. The substrate with the conductive film according to claim 15, wherein substrate with the conductive film further comprises an upper layer disposed on or above the conductive film, and
   the upper layer comprises chromium (Cr) and at least one element selected from the group consisting of nitrogen (N) and oxygen (O).

28. The substrate with the conductive film according to claim 15, wherein the conductive film has a surface roughness (Rq) of 0.600 nm or less.

* * * * *

UNITED STATES PATENT AND TRADEMARK OFFICE
CERTIFICATE OF CORRECTION

| | | |
|---|---|---|
| PATENT NO. | : 12,339,580 B2 | Page 1 of 1 |
| APPLICATION NO. | : 18/948779 | |
| DATED | : June 24, 2025 | |
| INVENTOR(S) | : Yusuke Ono et al. | |

It is certified that error appears in the above-identified patent and that said Letters Patent is hereby corrected as shown below:

On the Title Page

Item (30), the Foreign Application Priority Data has been omitted. Item (30) should read:
-- (30) Foreign Application Priority Data
Mar. 17, 2023 (JP)............... 2023-043149--

Signed and Sealed this
Twenty-second Day of July, 2025

Coke Morgan Stewart
*Acting Director of the United States Patent and Trademark Office*